US010013509B2

(12) United States Patent
Shuler et al.

(10) Patent No.: US 10,013,509 B2
(45) Date of Patent: Jul. 3, 2018

(54) AGRICULTURAL DRAINAGE DESIGN BASED ON SOIL MODELING

(71) Applicant: Trimble Navigation Limited, Sunnyvale, CA (US)

(72) Inventors: Joshua W. Shuler, Fort Collins, CO (US); Christopher van der Loo, Erie, CO (US)

(73) Assignee: Trimble Inc., Sunnyvale, CA (US)

( * ) Notice: Subject to any disclaimer, the term of this patent is extended or adjusted under 35 U.S.C. 154(b) by 722 days.

(21) Appl. No.: 14/663,291

(22) Filed: Mar. 19, 2015

(65) Prior Publication Data

US 2016/0275211 A1 Sep. 22, 2016

(51) Int. Cl.
*G06F 17/50* (2006.01)

(52) U.S. Cl.
CPC .............. *G06F 17/5004* (2013.01)

(58) Field of Classification Search
CPC .................................. G06F 17/5004
USPC ............................................. 703/1
See application file for complete search history.

(56) References Cited

U.S. PATENT DOCUMENTS

| 6,597,992 | B2 | 6/2003 | Rooney et al. |
| 6,959,245 | B2 | 10/2005 | Rooney et al. |
| 7,254,485 | B2 | 8/2007 | Rooney et al. |
| 7,870,684 | B2 | 1/2011 | Cox et al. |
| 9,242,669 | B2 | 1/2016 | Shuler |
| 9,904,747 | B2 | 2/2018 | Shuler et al. |
| 2003/0083819 | A1* | 5/2003 | Rooney ............... G01V 11/00 702/5 |
| 2004/0218979 | A1* | 11/2004 | McCoy ............... E01C 13/083 405/46 |
| 2012/0101861 | A1 | 4/2012 | Lindores |
| 2015/0202669 | A1* | 7/2015 | Kachman ............ B09C 1/002 210/170.07 |

(Continued)

FOREIGN PATENT DOCUMENTS

WO   WO 2016/032901 A1   3/2016

OTHER PUBLICATIONS

U.S. Appl. No. 14/663,273, NonFinal Office Action dated Jun. 15, 2017; 14 pages.

(Continued)

*Primary Examiner* — Andre Pierre Louis
(74) *Attorney, Agent, or Firm* — Swanson & Bratschun, L.L.C.

(57) ABSTRACT

Novel tools and techniques might provide for designing and/or implementing a drainage system for an agricultural area, based at least in part on three-dimensional soil modeling. In some embodiments, a computer system might identify one or more elevation points at each of a plurality of locations within the agricultural area, based on 3-D topographical surveys and 3-D soil profiles. A location of one or more outlet points within the agricultural area, where water will drain out, may be identified. The computer system might also determine location, length, and/or cross-sectional size for each of one or more drainage pipes (including main, sub-main, and lateral drainage pipes), based at least in part on optimization of location and/or costs based at least in part on the 3-D topographical surveys, the 3-D soil profiles, the one or more elevation points, and/or the location of the one or more outlet points.

21 Claims, 9 Drawing Sheets

(56) References Cited

U.S. PATENT DOCUMENTS

2016/0057920 A1  3/2016  Spiller et al.
2016/0275218 A1  9/2016  Shuler et al.

OTHER PUBLICATIONS

U.S. Appl. No. 14/663,273, Notice of Allowance dated Oct. 23, 2017; 19 pages.

* cited by examiner

AGRICULTURAL DRAINAGE DESIGN BASED ON SOIL MODELING

CROSS-REFERENCES TO RELATED APPLICATIONS

This application may be related to U.S. patent application Ser. No. 14/225,550 (the "'550 application"), filed on Apr. 17, 2014 by Joshua W. Shuler, entitled, "Rudder-Assisted Steering For Self-Propelled Drainage Equipment," U.S. patent application Ser. No. 14/469,790 (the "'790 application"), filed on Aug. 27, 2014 by Stephanie A. Spiller et al., entitled, "Three-Dimensional Elevation Modeling For Use In Operating Agricultural Vehicles," and U.S. patent application Ser. No. 14/663,273, filed on a date even herewith by Joshua W. Shuler et al., entitled, "Agricultural Terrain Forming Based on Soil Modeling."

The respective disclosures of these applications/patents (which this document refers to collectively as the "Related Applications") are incorporated herein by reference in their entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and computer software for designing and/or implementing a drainage system, and, in particular embodiments, to methods, systems, and computer software for designing and/or implementing a drainage system for an agricultural area, based at least in part on three-dimensional soil modeling.

BACKGROUND

In the field of agriculture, the cost of leveling, and the availability of land conducive to leveling, are enormously expensive and increasingly rare. Farmers are being forced to increase the quality and volume of crops produced on this limited land area as well as to find innovative ways to economically open up new tracts of land and make them produce the desired crops.

These new tracts of land add new challenges as they are not cost-effective to level and require new techniques for optimizing their productivity. Farmers are now using land-forming technologies customized for agriculture to optimize their field topography to meet the requirements of proper drainage and even irrigation coverage without compromising the thickness of topsoil across the field. Removing too much topsoil decreases the ultimate fertility of the soil and results in very poor crop performance in a lot of the affected areas. Further, drainage and irrigations systems, if not optimized, may become costly.

Although topographical surveys and/or soil profiles (in some cases, 3-D topographical surveys and/or 3-D soil profiles) are performed on land, such as farm land, such techniques have not been integrated in a consolidated system that takes such data into account to design a drainage system for the agricultural area and to install drainage pipes and other drainage system components, especially not using a computer system that is part of the consolidated system.

Hence, there is a need for more robust and scalable solutions for designing and/or implementing a drainage system, particularly for designing and/or implementing a drainage system for an agricultural area, based at least in part on three-dimensional soil modeling.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

Overview

Figure 1:
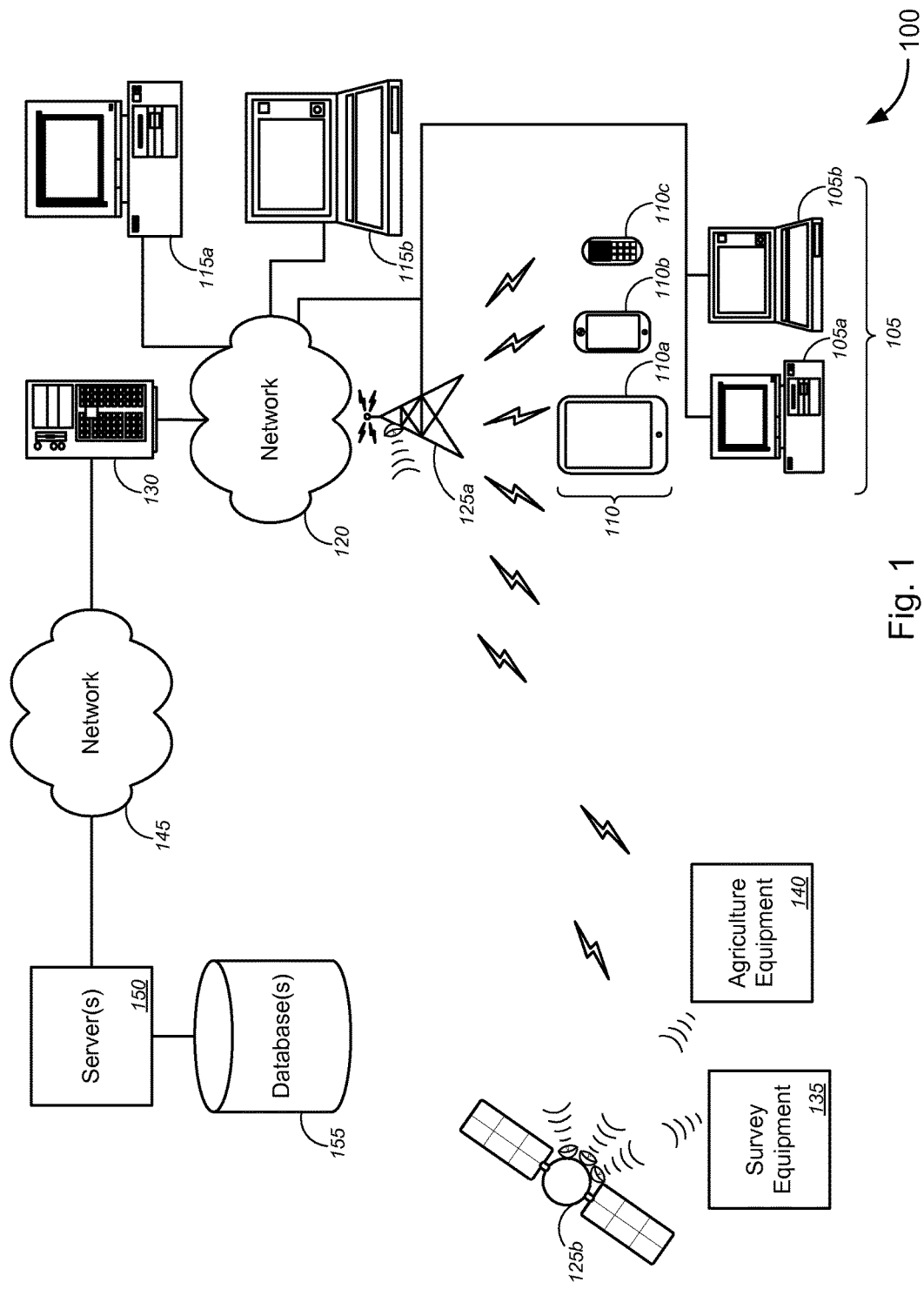
FIG. 1 is a schematic diagram illustrating a system for designing and/or implementing a drainage system for an agricultural area, based at least in part on three-dimensional soil modeling, in accordance with various embodiments.

Various embodiments provide techniques for designing and/or implementing a drainage system for an agricultural area, based at least in part on three-dimensional soil modeling.

In some embodiments, a computer system might identify one or more elevation points at each of a plurality of locations within the agricultural area (including highest and lowest elevation points in the entire agricultural area, local high and local low elevation points within portions of the agricultural area, and/or the like), based at least in part on 3-D topographical surveys and 3-D soil profiles. A location of one or more outlet points within the agricultural area, where water will drain out, may be identified. In some cases, the computer system might allow a user to select the location of at least one outlet point, while in other cases, the computer system might determine the location of at least one outlet point based at least in part on the 3-D topographical surveys and the 3-D soil profiles. The computer system might further determine location, length, and/or cross-sectional size for each of one or more drainage pipes (including main, sub-main, and lateral drainage pipes), based at least in part on optimization of location and/or costs that are based at least in part on the 3-D topographical surveys, the 3-D soil profiles, the one or more elevation points, and/or the location of the one or more outlet points.

For example, it may be determined—based on cost calculations, land characteristics, and/or the like—where to install one or more drainage pipes (also referred to as "drainage tiles") within the agricultural area, what length and cross-sectional size of each drainage pipe should be installed, how deep and at what slope to install each drainage pipe, what top soil and/or subsurface material layer (i.e., what soil profile of each soil layer) should be used to fill in the trench in which each drainage pipe is installed, how and where to connect each drainage pipe to another drainage pipe or to an outlet point, and/or the like. In some embodiments, the computer system might further send instructions to one or more agricultural machinery or equipment (including, but not limited to, at least one of earth-moving machines, tractors, plows, diggers, excavators, trucks, trailers, drainage pipe/tile laying machines, trenching machines, pipe installation machines, and/or other suitable machine or equipment that is configured to remove layer(s) of soil to particular depths, lay and connect drainage pipes, and cover the drainage pipes with appropriate layer(s) of soil set at desired grading and slope, and/or the like) to autonomously perform the installation of each of the one or more drainage pipes (and/or construction of other components of the drainage system) within the agricultural area, in accordance with the determined drainage system designs above.

In the manner described above (or a similar manner), a drainage system may be designed, based at least in part on three-dimensional soil modeling (including, without limitation, 3-D topographical surveys and/or 3-D soil profiles), while utilizing a consolidated system that determines the desired soil characteristics, identifying particular locations within the agricultural area for installing one or more drainage pipes, determining the length and cross-sectional size of each of the one or more drainage pipes, and instructing autonomous agricultural machines to perform installation of the one or more drainage pipes (or to otherwise construct components of the drainage system) within the agricultural area, based on such determinations.

The following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

The tools provided by various embodiments include, without limitation, methods, systems, and/or software products. Merely by way of example, a method might comprise one or more procedures, any or all of which are executed by a computer system. Correspondingly, an embodiment might provide a computer system configured with instructions to perform one or more procedures in accordance with methods provided by various other embodiments. Similarly, a computer program might comprise a set of instructions that are executable by a computer system (and/or a processor therein) to perform such operations. In many cases, such software programs are encoded on physical, tangible, and/or non-transitory computer readable media (such as, to name but a few examples, optical media, magnetic media, and/or the like).

Various embodiments described herein, while embodying (in some cases) software products, computer-performed methods, and/or computer systems, represent techniques that are not merely abstract ideas, such as a fundamental economic practice, a method of organizing human activity, an idea itself, or a mathematical relationship. To the extent that any abstract concepts are present in the various embodiments (for example if the identification of particular locations within the agricultural area for installing drainage pipes being based on topographical surveys and soil profiles are deemed to utilize algorithms and/or mathematical formulations, and thus might be deemed to be directed to an abstract idea), those concepts utilize techniques and systems (particularly as claimed) that amount to significantly more than the mathematical operation and the abstract idea. In particular, the various embodiments represent tangible, concrete improvements to existing technological areas, including, without limitation, agricultural technology, land or terrain forming technology, water drainage technology, and/or the like, and physical manifestations (i.e., physical changes to the land, changes to water drainage and water flows in the land, improvements to irrigation, improvements crop yield, and/or the like) can be observed and measured. Further, those concepts can be implemented as described herein by devices, software, systems, and methods that involve specific novel functionality (e.g., steps or operations), such as designing a drainage system for an agricultural area, based at least in part on three-dimensional soil modeling, implementing drainage pipe installation (and/or other drainage system component installation) based on such optimizations, and/or the like, to name a few examples, that extend beyond mere conventional computer processing operations. This functionality can produce tangible results outside of the implementing computer system, including, merely by way of example, changing and optimizing water flow or irrigation flow above ground and underground at locations throughout the agricultural area, optimizing crop yields, and/or the like.

In an aspect, a method for designing and implementing a drainage system for an agricultural area might be provided. The method might comprise creating, with a first computer, a three-dimensional topographic survey for the agricultural area and creating, with the first computer, a three-dimensional soil profile for the agricultural area. The three-dimensional topographic survey might comprise an outer boundary, a location of each of at least one main drainage area of the agricultural area, and a slope at each of a plurality of locations throughout the agricultural area within the outer boundary. The three-dimensional soil profile might comprise information about a depth to bedrock and a saturated hydraulic conductivity of soil at each of the plurality of locations within the agricultural area. The method might also comprise identifying, with a second computer, one or more elevation points at each of the plurality of locations within the agricultural area, based at least in part on the three-dimensional topographic survey, and identifying a location of one or more outlet points within the agricultural area where water will drain from the agricultural area. The method might comprise designating, with the second computer, one or more locations for installing one or more main drainage pipes, based at least in part on an optimization of location that is based at least in part on the three-dimensional soil profile, the one or more elevation points, and the location of the one or more outlet points. The method might further comprise determining, with the second computer, a cross-sectional size of the one or more main drainage pipes, based at least in part on the three-dimensional soil profile and the three-dimensional topographic survey.

According to some embodiments, the method might further comprise calculating, with the second computer, drainage flows for the plurality of locations within the agricultural area, based at least in part on the identified one or more elevation points, the slope, the depth to bedrock, and the saturated hydraulic conductivity at each of the plurality of locations. In some cases, designating the one or more locations for installing the one or more main drainage pipes might be further based at least in part on an optimization of location that is based at least in part on the calculated drainage flows.

In some embodiments, identifying the location of the one or more outlet points within the agricultural area where water will drain from the agricultural area might comprise providing, with the second computer, a user interface that allows a user to select outlet points within the agricultural area and receiving, with the second computer, user input identifying a location of at least one outlet point within the agricultural area. Alternatively, or additionally, identifying the location of the one or more outlet points within the agricultural area where water will drain from the agricultural area might comprise identifying, with the second computer, a location of at least one outlet point within the agricultural area, based at least in part on the three-dimensional topographic survey and the three-dimensional topographic survey.

In some cases, the method might further comprise determining, with the second computer, a drainage area for each main drainage pipe, based at least in part on the three-dimensional topographic survey. In such cases, determining the cross-sectional size of the one or more main drainage pipes might comprise determining a cross-sectional size of each main drainage pipe, based at least in part on the three-dimensional soil profile and the three-dimensional topographic survey, and further based at least in part on the drainage area for each main drainage pipe.

Merely by way of example, in some embodiments, the method might further comprise determining, with the second computer, a maximum rainfall amount for the agricultural area. In such embodiments, determining the cross-sectional size of the one or more main drainage pipes might comprise determining a cross-sectional size of each main drainage pipe, based at least in part on the three-dimensional soil profile and the three-dimensional topographic survey, and further based at least in part on the maximum rainfall amount. In some instances, determining the maximum rainfall amount for the agricultural area might be based at least in part on the maximum historical rainfall amount for the agricultural area during a twenty-four hour period. In some cases, the method might further comprise determining, with the second computer, a maximum drainage flow rate for the agricultural area, based at least in part on the maximum rainfall amount, the location of each main drainage area of the agricultural area, and the identified one or more elevation points, the slope, the depth to bedrock, and the saturated hydraulic conductivity of the soil at each of the plurality of locations within the agricultural area. In some instances, determining the cross-sectional size of the one or more main drainage pipes might be further based at least in part on the maximum drainage flow rate for the agricultural area.

According to some embodiments, the method might further comprise identifying, with the second computer, a location of each of a plurality of accumulation points within the agricultural area where water will accumulate, based at least in part on the three-dimensional topographic survey and the three-dimensional soil profile. The method might also comprise designating, with the second computer, a location for each of at least one of a plurality of sub-main drainage pipes or a plurality of lateral drainage pipes, based at least in part on an optimization of location that is based at least in part on the location of the one or more main drainage pipes and the location of the plurality of accumulation points. In some instances, the method might comprise determining, with the second computer, a cross-sectional size of each sub-main drainage pipe or each lateral drainage pipe, based at least in part on the three-dimensional soil profile and the three-dimensional topographic survey.

In some embodiments, the method might further comprise determining, with the second computer, at least one of a drainage area for each sub-main drainage pipe or a drainage area for each lateral drainage pipe, based at least in part on the three-dimensional topographic survey. In such embodiments, determining the cross-sectional size of each sub-main drainage pipe or each lateral drainage pipe might be further based at least in part on the at least one of the drainage area for each sub-main drainage pipe or the drainage area for each lateral drainage pipe. In some cases, the method might further comprise determining, with the second computer, a connection location for each lateral drainage pipe to connect to at least one of a main drainage pipe or a sub-main drainage pipe, determining, with the second computer, a connection location for each sub-main drainage pipe to connect to a main drainage pipe, and determining, with the second computer, a connection location for each main drainage pipe to connect to at least one of another main drainage pipe or an outlet point.

In some instances, the method might further comprise determining, with the second computer, a maximum flow capacity rate for each lateral drainage pipe, based at least in part on the cross-sectional size of that lateral drainage pipe, determining, with the second computer, a maximum flow capacity rate for each sub-main drainage pipe, based at least in part on the cross-sectional size of that sub-main drainage pipe, and determining, with the second computer, a maximum flow capacity rate for each main drainage pipe, based at least in part on the cross-sectional size of that main drainage pipe. The method might also comprise confirming, with the second computer, that the maximum flow capacity rate, for each main drainage pipe, is equal to or exceeds the combined maximum flow capacity rate of each lateral drainage pipe and each sub-main drainage pipe that drain into that main drainage pipe.

Alternatively, or additionally, the method might further comprise determining, with the second computer, a maximum flow capacity rate for each lateral drainage pipe, based at least in part on the material of that lateral pipe, determining, with the second computer, a maximum flow capacity rate for each sub-main drainage pipe, based at least in part on the material of that sub-main drainage pipe, and determining, with the second computer, a maximum flow capacity rate for each main drainage pipe, based at least in part on the material of that main drainage pipe. The method might also comprise confirming, with the second computer, that the maximum flow capacity rate, for each main drainage pipe, is equal to or exceeds the combined maximum flow capacity rate of each lateral drainage pipe and each sub-main drainage pipe that drain into that main drainage pipe.

Merely by way of example, in some cases, the method might further comprise identifying, with the second computer, each accumulation point within the agricultural area that is located at a lower elevation than at least one outlet point of the one or more outlet points, based at least in part on the three-dimensional topographic survey. The method might also comprise determining, with the second computer, a drainage plan for each such accumulation point, based at least in part on an optimization of costs of pumping water at each such accumulation point to an elevation higher than the elevation of the at least one outlet point.

In some embodiments, the method might further comprise determining, with the second computer, at least one of a location, a length, a depth, or a cross-sectional size of the one or more main drainage pipes, based at least in part on an optimization of costs for the drainage system. The method might also comprise determining, with the second computer, at least one of a location, a length, a depth, or a cross-sectional size of one or more sub-main drainage pipes, based at least in part on the optimization of costs for the drainage system. The method might further comprise determining, with the second computer, at least one of a location, a length, a depth, or a cross-sectional size of one or more lateral drainage pipes, based at least in part on the optimization of costs for the drainage system. In some cases, the optimization of costs of the drainage system might be based at least in part on minimizing the length of at least one of the one or more main drainage pipes, the one or more sub-main drainage pipes, or the one or more lateral drainage pipes.

According to some embodiments, the method might further comprise determining, with the second computer, a depth of the one or more main drainage pipes, based at least in part on the three-dimensional soil profile and the three-dimensional topographic survey. The method might also comprise determining, with the second computer, a location and a depth of one or more sub-main drainage pipes and determining, with the second computer, a location and a depth of one or more lateral drainage pipes, both based at least in part on the three-dimensional soil profile and the three-dimensional topographic survey. In some embodiments, designating or determining the location of the one or more main drainage pipes and the cross-sectional size of the one or more main drainage pipes might be further based at least in part on any existing drainage structures located within the agricultural area. In some instances, the first computer and the second computer might be the same computer.

In another aspect, a computer system might comprise one or more processors and a computer readable medium in communication with the one or more processors. The computer readable medium might have encoded thereon a set of instructions executable by the one or more processors to cause the computer system to perform one or more operations. The set of instructions might comprise instructions for creating a three-dimensional topographic survey for the agricultural area that comprises an outer boundary, a location of each of at least one main drainage area of the agricultural area, and a slope at each of a plurality of locations throughout the agricultural area within the outer boundary, and instructions for creating a three-dimensional soil profile for the agricultural area that comprises information about a depth to bedrock and a saturated hydraulic conductivity of soil at each of the plurality of locations within the agricultural area. The set of instructions might also comprise instructions for identifying one or more elevation points at each of the plurality of locations within the agricultural area, based at least in part on the three-dimensional topographic survey, and instructions for identifying a location of one or more outlet points within the agricultural area where water will drain from the agricultural area. The set of instructions might comprise instructions for designating one or more locations for installing one or more main drainage pipes, based at least in part on an optimization of location that is based at least in part on the three-dimensional soil profile, the one or more elevation points, and the location of the one or more outlet points. The set of instructions might further comprise instructions for determining a cross-sectional size of the one or more main drainage pipes, based at least in part on the three-dimensional soil profile and the three-dimensional topographic survey.

Various modifications and additions can be made to the embodiments discussed without departing from the scope of the invention. For example, while the embodiments described above refer to particular features, the scope of this invention also includes embodiments having different combination of features and embodiments that do not include all of the above described features.

Specific Exemplary Embodiments

We now turn to the embodiments as illustrated by the drawings. FIGS. 1-7 illustrate some of the features of the method, system, and apparatus for designing and/or implementing a drainage system for an agricultural area, based at least in part on three-dimensional soil modeling, as referred to above. The methods, systems, and apparatuses illustrated by FIGS. 1-7 refer to examples of different embodiments that include various components and steps, which can be considered alternatives or which can be used in conjunction with one another in the various embodiments. The description of the illustrated methods, systems, and apparatuses shown in FIGS. 1-7 is provided for purposes of illustration and should not be considered to limit the scope of the different embodiments.

With reference to the figures, FIG. 1 is a general schematic diagram illustrating a system 100 for designing and/or implementing a drainage system for an agricultural area, based at least in part on three-dimensional soil modeling, in accordance with various embodiments.

In the embodiment of FIG. 1, system 100 might include one or more user devices 105 associated with a user (e.g., an owner, manager, or operator of an agricultural property, which might include, without limitation, a farm, a ranch, an orchard, a plantation, and/or the like). The one or more user devices 105 might include, but are not limited to, a desktop computer(s) 105a, a laptop computer(s) 105b, and one or more mobile user devices 110, which might include, without limitation, a tablet computer(s) 110a, a smart phone 110b, a mobile phone 110c, and/or the like. System 100 might further include, but is not limited to, one or more computing systems 115 (including a desktop-based computing system 115a, a laptop-based computing system 115b, or the like) and a server computer 130. In some embodiments, system 100 might further include one or more survey equipment 135 and one or more agricultural equipment 140. The one or more survey equipment 135 might include, without limitation, at least one of air-based land survey equipment, land-based survey equipment, hand-held survey equipment, vehicle-based survey equipment, satellite-based land survey equipment, cameras, and/or the like. The one or more agricultural equipment 140 might include, but are not limited to, at least one of earth-moving machines, tractors, plows, diggers, excavators, trucks, trailers, drainage pipe/tile laying machines, trenching machines, pipe installation machines, and/or other suitable machine or equipment that is configured to remove layer(s) of soil to particular depths, lay and connect drainage pipes, and cover the drainage pipes with appropriate layer(s) of soil set at desired grading and slope, and/or the like.

Each of the one or more user devices 105/110, the one or more computing systems 115, the server computer 130, the one or more survey equipment 135, and the one or more agricultural equipment 140 might communicatively couple to each other via network 120, in some cases, via one or more telecommunications relay systems 125. The one or more telecommunications relay systems 125 might include, without limitation, one or more wireless network interfaces (e.g., wireless modems, wireless access points, and the like), one or more towers, one or more satellites, and/or the like.

According to some embodiments, system 100 might further comprise network 145, server(s) 150, and database(s) 155 that communicatively couple to server computer 130. In some instances, network 120 and network 145 can each include a local area network ("LAN"), including, without limitation, a fiber network, an Ethernet network, a Token-Ring™ network and/or the like; a wide-area network ("WAN"); a wireless wide area network ("WWAN"); a virtual network, such as a virtual private network ("VPN"); the Internet; an intranet; an extranet; a public switched telephone network ("PSTN"); an infra-red network; a wireless network, including, without limitation, a network operating under any of the IEEE 802.11 suite of protocols, the Bluetooth™ protocol known in the art, and/or any other wireless protocol; or any combination of these and/or other networks. In a particular embodiment, the network 120 or 145 might include an access network of the service provider (e.g., an Internet service provider ("ISP")). In another embodiment, the network 120 or 145 might include a core network of the service provider, and/or the Internet.

Figure 2A:
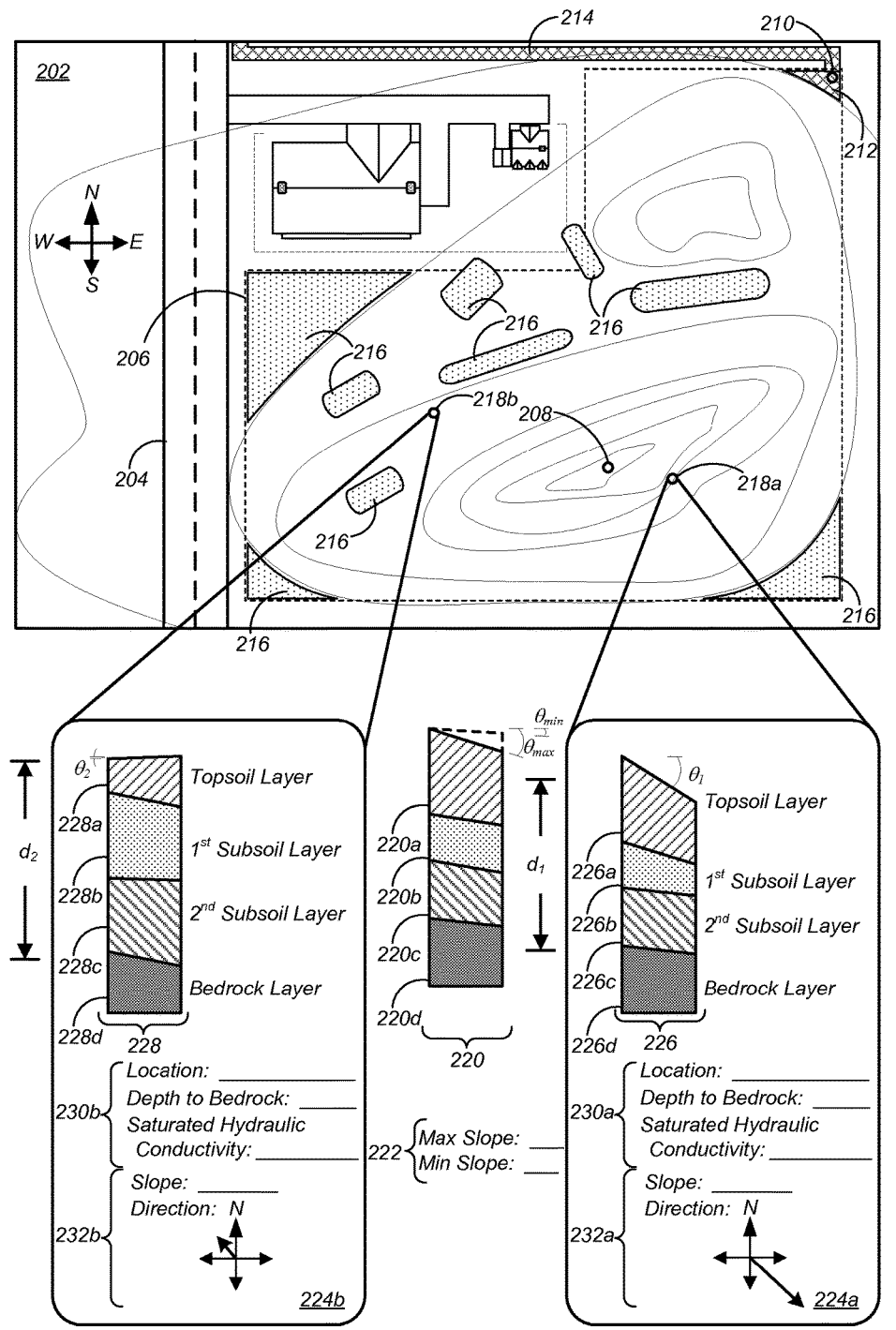
FIGS. 2A and 2B are schematic diagrams illustrating agricultural land and soil characteristics that can be modeled and taken into consideration when designing and/or implementing a drainage system for an agricultural area, based at least in part on three-dimensional soil modeling, in accordance with various embodiments.
Figure 2B:
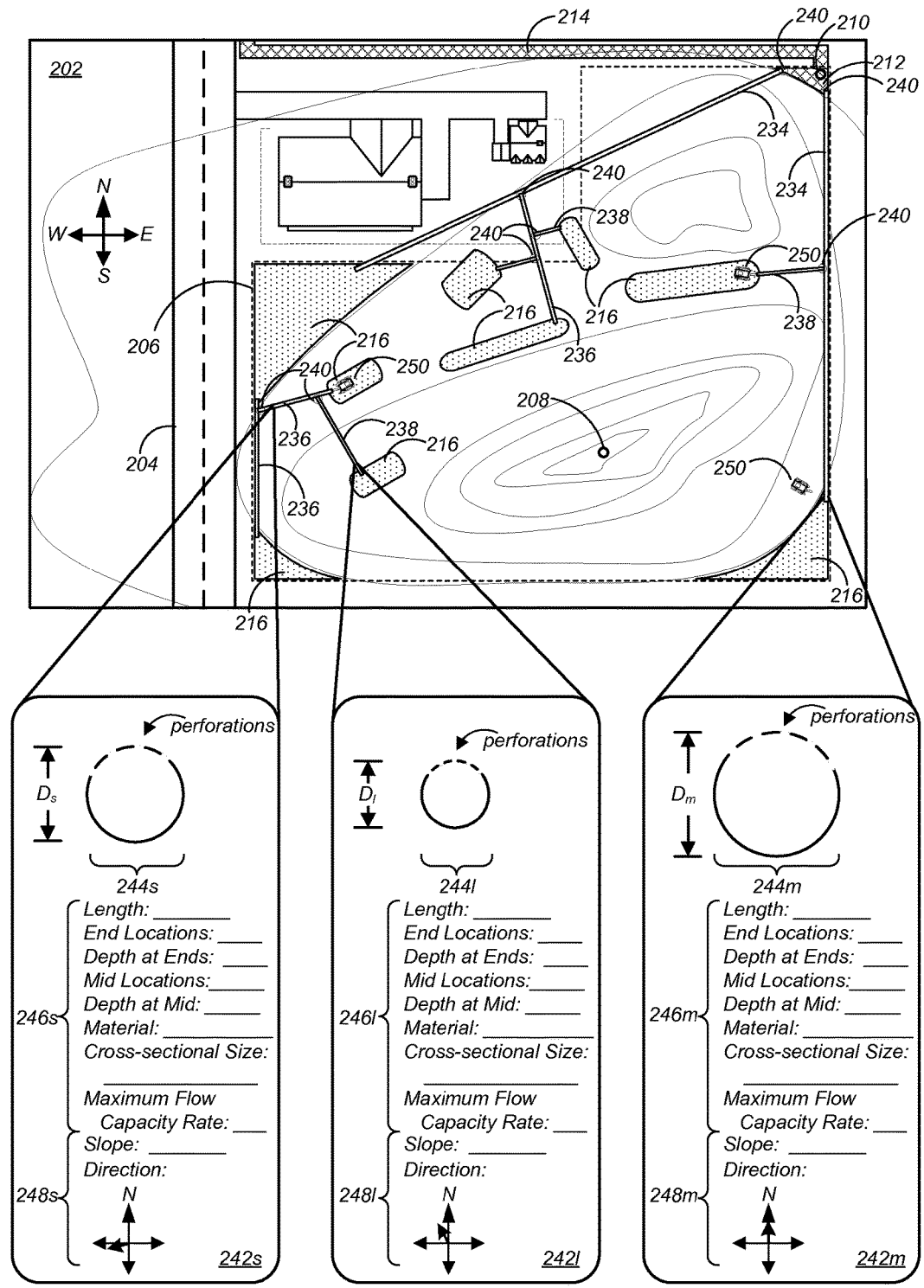

In operation, one or more of computers 115a or 115b, server 130, and/or server(s) 150 might perform each of the processes in the methods described in detail with respect to FIGS. 3-5 below, based at least in part on land and soil characteristics as shown in FIGS. 2A and 2B (that, in some cases, may be part of 3-D soil modeling, including, without limitation, 3-D topographical survey(s) and/or 3-D soil profile(s) of the agricultural area, or the like). The one or more user devices 105 (including the one or more mobile user devices 110) might allow the user to control any or all of the processes for designing or implementing a drainage system for an agricultural area, from ordering 3-D topographical surveys and/or 3-D soil profiles of the agricultural area (each of whose data is obtained by survey equipment 135), to viewing the 3-D topographical surveys and/or 3-D soil profiles (or at least information derived from these sources or from other sources), to instructing one or more of computers 115a or 115b, server 130, and/or server(s) 150 to perform each of the processes in the methods 300-500—including, without limitation, identifying one or more elevation points, identifying one or more outlet points, determining drainage areas for each drainage pipe, determining a maximum rainfall amount, calculating drainage flows, determining a maximum drainage flow rate, determining accumulation points, determining location, length, depth, and/or cross-sectional size of each drainage pipe, and sending instructions to agricultural equipment to install each drainage pipe (and/or other components of the drainage system), and/or the like.

Herein, in some embodiments, the agricultural equipment 140 and/or the survey equipment 135 might autonomously operate (i.e., operate without direct human control, except for general instructions to obtain survey information or to install one or more drainage pipes (and/or other components of the drainage system, or the like)) based at least in part on the instructions sent to it from the user via the user devices 105 and/or from any of the computers 115a or 115b, server 130, and/or server(s) 150, or the like. In alternative embodiments, the agricultural equipment 140 and/or the survey equipment 135 might be configured to operate in an "autopilot" mode that is similar to the autonomous operation above, except that a human operator (who is either located in, at, or near the equipment 135/140, or located remotely with remote control functionality enabled) might also be (physically or remotely) "present" to switch from "autopilot" mode to "manual mode." In "manual mode," displays might be provided to the human operator to indicate the determined (in some cases, optimized) paths for the agricultural equipment 140 and/or the survey equipment 135, as well as the actual positions and movements of the agricultural equipment 140 and/or the survey equipment 135 so that the human operator can maintain or correct the course of the agricultural equipment 140 and/or the survey equipment 135 to match the determined (or optimized) paths. In some cases, the human operator might disregard the determined (or optimized) path, and the computers 115a or 115b, server 130, and/or server(s) 150, or the like might perform updated determinations and/or calculations in response to the course by the human operator.

FIGS. 2A and 2B (collectively, "FIG. 2") are schematic diagrams illustrating agricultural land and soil characteristics that can be modeled and taken into consideration when designing and/or implementing a drainage system for an agricultural area, based at least in part on three-dimensional soil modeling, in accordance with various embodiments. FIG. 2A depicts examples of soil profile or soil characteristics as well as characteristics of the land as understood or derived from topographical surveys, while FIG. 2B depicts characteristics of example drainage pipes as well as locations and interconnections of the drainage pipes in relation to accumulations points, elevation points, and outlet points.

With reference to FIG. 2, system 200 might comprise location or region 202, which might include, without limitation, one or more roadways or vehicular paths 204, and an agricultural area 206, which might be part of an agricultural property (e.g., a farm, a plantation, a ranch, an orchard, and/or the like). In some cases, the agricultural property might include a residence (e.g., farmhouse, ranch house, etc.) and a covered work facility (e.g., a barn, a covered storage structure, and/or the like), with a vehicle access path between each of the residence and the covered work facility to the roadway 204. A full or partial fence might surround at least a portion of the residence and/or covered work facility. Although the particular agricultural property or agricultural area 206 in FIG. 2 does not possess any bodies of water, waterways, rock formations, and/or other natural (or manmade) landscape features, or the like, the various embodiments are not so limited and the various systems and methods herein may be applied to design and/or implement a drainage system for the agricultural area, based at least in part on three-dimensional soil modeling, in view of (or regardless of) presence of any combination of bodies of water, waterways, rock formations, and/or other natural (or manmade) landscape features, or the like. In some embodiments, in the process of implementing or installing at least portions of the drainage system, mass haul techniques may be implemented. Implementation of mass haul optimization for agricultural terrain forming, which may be applied herein, is described in detail in the 0420.24 application, which has already been incorporated herein by reference in its entirety for all purposes.

With regard to designing and/or implementing a drainage system for an agricultural area (in some cases, based at least in part on three-dimensional soil modeling), system 200 might comprise survey equipment (not shown in FIG. 2), which might include, without limitation, at least one of air-based land survey equipment, land-based survey equipment, hand-held survey equipment, vehicle-based survey equipment, satellite-based land survey equipment, cameras, and/or the like. System 200 might further comprise one or more agricultural machinery or equipment 250, which might include, but are not limited to, at least one of earth-moving machines, tractors, plows, diggers, excavators, trucks, trailers, drainage pipe/tile laying machines, trenching machines, pipe installation machines, and/or other suitable machine or equipment that is configured to remove layer(s) of soil to particular depths, lay and connect drainage pipes, and cover the drainage pipes with appropriate layer(s) of soil set at desired grading and slope, and/or the like.

With reference to FIG. 2, a contour map is shown overlaid over the depiction (or map illustration) of at least the agricultural area 206. It should be appreciated that the cardinal directions indicated in FIG. 2 are merely illustrative and are used to provide context for the direction of slope for slope information 232 in data 224, as described in detail below.

In operation, as described in greater detail below with respect to FIGS. 3 to 5B, a three-dimensional (or "3-D") topographical survey(s) and a 3-D soil profile(s) might be created for agricultural area 206. With reference to FIG. 2, various locations or points of interest might be determined or identified, based at least in part on the 3-D topographical survey(s) and/or the 3-D soil profile(s). In some embodiments, the various locations or points of interest might include, without limitation, the highest elevation point 208, the lowest elevation point 210, other elevation points between the highest and lowest elevation points (not shown), one or more outlet points 212, one or more water paths 214 that drain water from the one or more outlet points to a location outside the agricultural area (and/or outside the agricultural property), one or more accumulation points 216, and/or one or more identified locations 218, or the like. In FIG. 2, the outlet point 212 is also the main drainage area for the agricultural area. However, the various embodiments are not so limited, and the one or more outlet points 212 and the main drainage area(s) need not be the same area or need not be at the same location. According to some embodiments, the one or more water paths 214 might be a main ditch 214 into which water flows from one or more main drainage pipes or one or more outlet points 212; the main ditch 214 may or may not also serve as to convey water to a location outside the agricultural area (and/or outside the agricultural property).

As shown in the embodiment of FIG. 2A, soil profile 220 might represent model or desired (ranges of values) for soil conditions for the agricultural area. In some embodiments, model soil profile 220 might include model slope information 222, which might include a maximum slope $\theta_{max}$ and a minimum slope $\theta_{min}$. The maximum slope $\theta_{max}$ might represent a slope above which agricultural machinery or equipment 250 might be likely to tip over, or the like, while the minimum slope $\theta_{min}$ might represent a slope below which issues of insufficient water drainage and water flow might arise, or the like. The soil profile 220 might indicate a model topsoil layer 220a, a first subsurface material layer 220b and a second subsurface material layer 220c (in some cases, the first and second subsurface material layers 220b and 220c might be the same layer, while in other cases a third subsurface material layer or additional subsurface material layers might be present), as well as a substratum or bedrock layer 220d. Herein, "topsoil" or "topsoil layer" might refer to a layer of earth that is rich in mineral and organic matter that promotes or facilitates plant growth or the like. The "substratum" layer might refer to a bedrock layer, which might include any combination of granite, basalt, quartzite, limestone, sandstone, or other rocky structure that serves as a foundational layer. The "subsurface material" or "subsoil" layer(s) might refer to intermediate layer(s) between the topsoil layer and the substratum layer, and might include a mineral-rich (organic-free or low concentration organic substance) layer, a sand or silt layer, a parent material layer, and/or the like. The "parent material" layer might refer to an underlying geological material layer that may include consolidated or unconsolidated mineral material. The mineral-rich layer and the sand or silt layer typically inherit structure and minerals from the parent material in the parent material layer, and thus might reflect chemical or physical alterations of the parent material.

In the example of FIG. 2A, the one or more identified locations 218 might include, but are not limited to, a (relatively) "sloped" location 218a and a (relatively) "flat" location 218b. Compared with model soil profile 220, the sloped location 218a might have a slope $\theta_1$ that exceeds the maximum slope $\theta_{max}$, while the flat location 218b might have a slope $\theta_2$ that is less than the minimum slope $\theta_{min}$, as shown in FIG. 2A. Locations having a slope that is greater than the model minimum slope ($\theta_{min}$) but less than the model maximum slope ($\theta_{max}$) (as shown with respect to slopes in the model soil profile 220 in FIG. 2A) may be deemed normal or acceptable for drainage flow, particularly when considered with elevation and/or accumulation points nearby.

As shown in the embodiment of FIG. 2A, data 224 might represent or display information regarding the soil profile, the soil conditions, and related information at each of the one or more identified locations 218. For example, data 224a might represent information regarding the sloped location 218a, while data 224b might represent information regarding the flat location 218b. The information provided in data 224 might include soil profile information 226 for the sloped location 218a, soil profile information 228 for the flat location 218b, additional information 230, slope information 232, and/or the like. In particular, in FIG. 2A, soil profile 226 might indicate information regarding the topsoil layer 226a, the first subsurface material or subsoil layer 226b, the second subsurface material or subsoil layer 226c, and the bedrock layer 226d of the sloped location 218a. Similarly, soil profile 228 might indicate information regarding the topsoil layer 228a, the first subsurface material or subsoil layer 228b, the second subsurface material or subsoil layer 228c, and the bedrock layer 228d of the flat location 218b. Although not shown, other identified locations 218 might have corresponding data 224 that provide soil profile information regarding the soil composition and related information at those other locations 218.

The additional information 230, which might represent soil condition and related information, might include, without limitation, information regarding the location, the depth to bedrock (e.g., $d_1$ for the location 218a and $d_2$ for the location 218b, and so on), the saturated hydraulic conductivity (or saturation factor $K_{sat}$), and/or other related information, or the like for each identified location 218. In some instances, the location might include the latitude and longitude, and, in some cases, might further include altitude (or elevation from sea level) of a center of the identified location 218 that was tested or analyzed to produce the soil profile 226 or 228. In some cases, the location might include coordinates (including latitude, longitude, and, in some case, altitude or elevation from sea level) of three or more corners of a geographic patch of land representing the particular identified location 218. According to some embodiments, the additional information 230 might further include characteristics including, without limitation, root zone depth, soil texture components (e.g., sand, clay, coarse fragment content, and/or the like), soil texture classes, plant-available water, compaction and hardpan characteristics, nutrient holding capacity and levels, salt concentrations, toxicity concentrations, and/or the like. Based on the additional information 230, users can be provided with information on available water, soil texture, nutrient holding capacity, nutrient distribution, etc. In some cases, manipulation of any of these information or characteristics (or a combination of these characteristics) might demonstrate differential rates of fertilizer and amendment applications. In some embodiments, the additional information 230 may be output in a consumable form to a 3-D design engine that may be used to optimize the drainage system and/or to optimize characteristics of the drainage system.

In a similar manner as with the additional information 230, slope information 232 might include, but is not limited to, magnitude of slope at the specific identified location 218 (and/or average magnitude of slope at the particular identified location 218) and direction of slope at the specific identified location 218 (and/or average direction of slope at the particular identified location 218), which can be represented in any suitable manner (not necessarily limited to using diagrammatic notation of the cardinal directions with the additional arrow indicating both direction and magnitude of slope). The additional information 230, according to some embodiments, might further include topsoil depth values, specific soil compositions (including depths of layers) for the specific identified location 218, average soil compositions (including average depths of layers) throughout the patch of land representing the identified location 218. Additional information 230a and slope information 232a might correspond to sloped location 218a, while additional information 230b and slope information 232b might correspond to flat location 218b, and so on.

In some cases, data 224 might represent data derived from the created 3-D soil profile(s) and/or the created 3-D topographical survey(s) of the agricultural area 206. Alternatively or additionally, data 224 might represent information regarding the soil profile, the soil conditions, and related information derived from other sources.

With reference to FIG. 2B, based at least in part on the 3-D topographical survey(s) and/or the 3-D soil profiles, or based at least in part on some or all of the information as provided in data 224 for each identified location 218 (not limited to the sloped location 218a and the flat location 218b), it may be determined what the location, length, depth, cross-sectional size, and slope of the various drainage pipes (which might also be referred to as "drainage tiles" or the like) might be when designing and/or implementing a drainage system for the agricultural area 206. For example, as shown in the embodiment of FIG. 2B, the drainage system might include, without limitation, one or more main drainage pipes 234, one or more sub-main drainage pipes 236, one or more lateral drainage pipes 238, and/or the like. Each of the drainage pipes might be a flexible tube or a rigid pipe that has one or more perforations or holes at a top portion thereof that allow water to enter the drainage pipe from the top. Once water enters the drainage pipe, the bottom of the drainage pipe acts to convey water to other parts of the agricultural area 206 (not unlike an aqueduct system, albeit an underground or buried aqueduct system). It may also be determined the type and placement of connectors or connections that join one drainage pipe to another (e.g., main pipe to another main pipe, sub-main pipe to a main pipe, a lateral pipe to a main pipe or a sub-main pipe, and/or the like), or that join one drainage pipe to an outlet point (e.g., main pipe to an outlet point, or the like). As shown in FIG. 2B, connector locations 240 might indicate where each drainage pipe connects with another or with the one or more outlet points 212.

In the embodiment of FIG. 2B, the system 200 might include, for each drainage pipe 234-238, data 242 about the drainage pipe itself. Data 242, according to some embodiments, might include, without limitation, a representative diagram(s) 244 of the drainage pipe, additional information 246 about the drainage pipe, and slope information 248 about the installed drainage pipe. The representative diagram(s) 244 might include, but is not limited to, one or more diagrams indicating the type and/or number of perforations per predetermined portion of length of the drainage pipe, the diameter or cross-sectional size D of the drainage pipe, and/or the like. The additional information 246 for each drainage pipe might include, without limitation, information regarding at least one of length, end locations (i.e., first end location and second end location, or the like), depth of the ends (e.g., depth at each of the first and second end locations, or the like), mid locations (i.e., one or more midpoint locations or location of each representative middle portion of the drainage pipe, or the like), depth at the mid locations (i.e., depth at the one or more midpoint locations or depth at the location of each representative middle portion of the drainage pipe, or the like), material(s) that the drainage pipe is made of, cross-sectional size(s) (with more than one value included for non-uniform sized drainage pipes), maximum flow capacity rate (which might be as calculated and as described in detail below with respect to FIG. 4), and/or the like. In some cases, the additional information 246 might include information regarding type and location of each connection with another drainage pipe (as well as the type of pipe that is connected at those locations). The slope information 248, for each drainage pipe, might include, but is not limited to, the magnitude of slope at each of one or more portions of the length of the drainage pipe and the direction of slope at each of the one or more portions of the length of the drainage pipe.

As shown in FIG. 2B, representative diagram(s) 244m, diameter $D_m$, additional information 246m, and slope information 248m might correspond to one of the one or more main drainage pipes 234, while representative diagram(s) 244s, diameter $D_s$, additional information 246s, and slope information 248s might correspond to one of the one or more sub-main drainage pipes 236, and representative diagram(s) 244l, diameter $D_l$, additional information 246l, and slope information 248l might correspond to one of the one or more lateral drainage pipes 238.

Once the location, length, depth, slope, and/or cross-sectional size of each drainage pipe 234-238 has been designated or determined, based on the 3-D topographical survey(s), the 3-D soil profile, 3-D models of drainage system or drainage flows (that are based on the 3-D topographical survey(s) and/or the 3-D soil profile, etc.), and/or the information derived from one or more of these (collectively, "3-D soil modeling"), instructions may be sent to one or more agricultural machinery or equipment 250 to install each drainage pipe 234-238 having the determined length and cross-sectional size at the designated or determined location and depth (with the determined slope). Installation of each drainage pipe 234-238 might include the one or more agricultural machinery or equipment 250 forming a trench by removing existing soil or soil layers, laying that drainage pipe (or drainage tile) in the trench, and filling the remainder of the trench on top of the installed drainage pipe with either the same soil/soil layers or different soil/soil layers, such that the resultant soil or soil layers have desired topsoil depth, subsurface material depth, saturated hydraulic conductivity, and/or slope, and/or the like.

According to some embodiments, a drainage coefficient may also be calculated or maintained. For example, it may be determined how much water can be drained from the agricultural area 206 within a 24-hour period. For example, if ⅜ inch of water is a standard amount that can be drained within a 24-hour period, then the drainage coefficient is ⅜. In some embodiments, models can be utilized to optimize the designs for the drainage system, and the drainage coefficient may be used to constrain design elements in the models.

Figure 3:
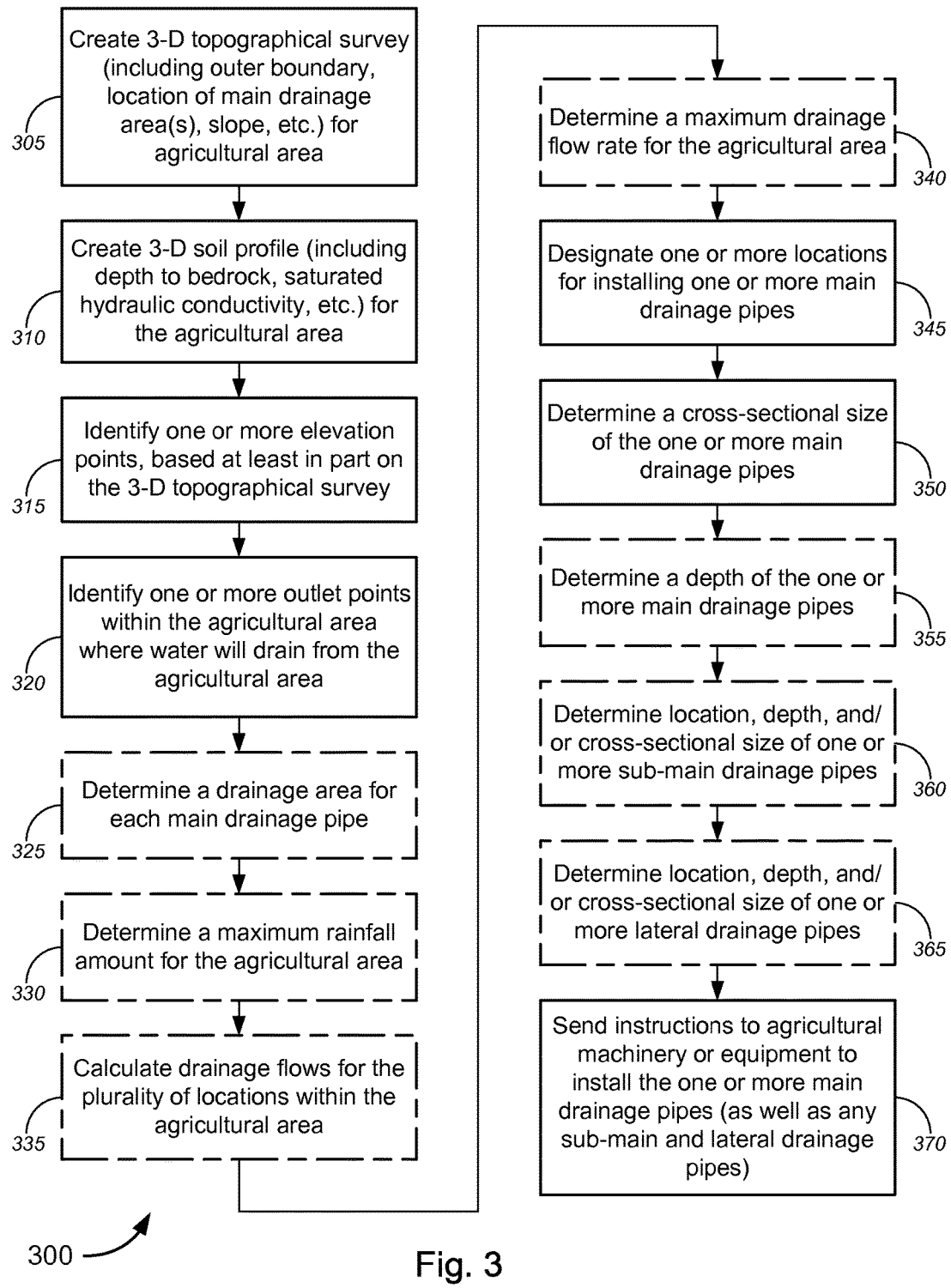
FIG. 3 is a flow diagram illustrating a method for designing and/or implementing a drainage system for an agricultural area, based at least in part on three-dimensional soil modeling, in accordance with various embodiments.

FIG. 3 is a flow diagram illustrating a method 300 for designing and/or implementing a drainage system for an agricultural area, based at least in part on three-dimensional soil modeling, in accordance with various embodiments. While the techniques and procedures are depicted and/or described in a certain order for purposes of illustration, it should be appreciated that certain procedures may be reordered and/or omitted within the scope of various embodiments. Moreover, while the method illustrated by FIG. 3 can be implemented by or with (and, in some cases, are described below with respect to) the systems 100 and 200 of FIGS. 1 and 2, respectively (or components thereof), such methods may also be implemented using any suitable hardware implementation. Similarly, while each of the system 100 (and/or components thereof) of FIG. 1 or the system 200 (and/or components thereof) of FIG. 2 can operate according to the method illustrated by FIG. 3 (e.g., by executing instructions embodied on a computer readable medium), the systems 100 and 200 can each also operate according to other modes of operation and/or perform other suitable procedures.

In the embodiment of FIG. 3, method 300 might comprise, at block 305, creating a three-dimensional topographic survey for the agricultural area. In some cases, the three-dimensional topographic survey might comprise an outer boundary, a location of each of at least one main drainage area of the agricultural area, and/or a slope at each of a plurality of locations throughout the agricultural area within the boundary (i.e., within the agricultural area), or the like. The outer boundary might represent a property boundary for a farm or other agricultural land area, a boundary around actual portions of the farm or other agricultural land area in which the topsoil and/or subsurface material should be monitored and levels of which may be adjusted as described in detail in the 0420.24 Application (which is already incorporated herein by reference in its entirety), a boundary around actual portions of the farm or other agricultural land area in which drainage systems and water flow should be monitored and drainage systems should be installed or otherwise modified or adjusted in accordance with the various embodiments, and/or the like). At block 310, method 300 might comprise creating a three-dimensional soil profile for the agricultural area. In some instances, the three-dimensional soil profile might comprise information about a depth to bedrock and a saturated hydraulic conductivity (sometimes referred to a saturation factor $K_{sat}$, or the like) of soil at each of the plurality of locations within the agricultural area. In some embodiments, the three-dimensional soil profile, at particular locations, might further comprise at least one of topsoil depth, a subsurface material depth, a depth of subsurface material between the topsoil and the bedrock, interior elevation measurement points, manual elevation measurement points runoff coefficient, consolidated soil composition, top-soil composition, and/or subsurface soil composition, or the like.

According to some embodiments, method 300, at block 315, might comprise identifying one or more elevation points at each of the plurality of locations within the agricultural area, based at least in part on the three-dimensional topographic survey. The one or more elevation points might include, without limitation, the highest elevation point in the entire agricultural area, the lowest elevation point in the entire agricultural area, local highest elevation points in particular regions or portions of the agricultural area, local lowest elevation points in particular regions or portions of the agricultural area, intermediate elevation points within the agricultural area, and/or the like. In some embodiments, at least one of the elevation points might be identified in proximity to locations having particular slope and/or having particular saturation factor or runoff coefficient. For example, low elevation points might be identified in proximity to low relative slope and/or high saturation factor or low runoff coefficient; such confluence or combination of characteristics might indicate an area in which water might accumulate. Similarly, high elevation points might be identified in proximity to high relative slope and/or low saturation factor or high runoff coefficient; such confluence or combination of characteristics might indicate an area that allows for natural flow of water, and that may be minimally adjusted to direct water to desired locations. Other combinations of these characteristics might indicate drainage flow somewhere within the spectrum bookended by these two extreme cases.

In some embodiments, other characteristics of the soil that may be considered when designing the drainage system or when generating 3-D models for designing the drainage system might include, without limitation, bulking factor of topsoil and/or subsurface material, shrinkage factor of the soil, soil physical composition, soil compaction, soil erodibility (which might be represented by an erosion index or erodibility index, or the like), soil chemical composition, surface tension, modeled flow rate, water capacity, and/or the like. Herein, "bulking factor" might refer to a ratio comparing a volume of a quantity of moist granular material to a volume of the same quantity when dry, or the like. Herein also, "shrinkage factor" might refer to capacity of soil or soil layers to shrink or swell when the soil becomes wet or dry. Any combination, some, or all of the characteristics referred to above may form the basis of determinations of location, depth, and cross-sectional size of the various pipes as described in the processes below, and/or may form the basis for 3-D models that may be used to make such determinations.

At block 320, method 300 might comprise identifying a location of one or more outlet points within the agricultural area where water will drain from the agricultural area. In some cases, identifying the location of the one or more outlet points within the agricultural area where water will drain from the agricultural area might comprise providing, with a computer, a user interface that allows a user to select outlet points within the agricultural area, and receiving, with the computer, user input identifying a location of at least one outlet point within the agricultural area. Alternatively, or in addition, identifying the location of the one or more outlet points within the agricultural area where water will drain from the agricultural area might comprise identifying, with the computer, a location of at least one outlet point within the agricultural area, based at least in part on the three-dimensional topographic survey and the three-dimensional topographic survey.

Method 300, at optional block 325, might comprise determining a drainage area, or location of the drainage area, for each main drainage pipe, in some cases, based at least in part on the three-dimensional topographic survey. In some embodiments, method 300 might further comprise determining a maximum rainfall amount for the agricultural area (optional block 330). In some instances, determining the maximum rainfall amount for the agricultural area might be based at least in part on the maximum historical rainfall amount for the agricultural area during a predetermined period (e.g., during a twenty-four hour period, during a week, during a month, during a year, during a growing season, during Spring, during Summer, during Autumn, during Winter, and/or the like).

At optional block 335, method 300 might comprise calculating drainage flows for the plurality of locations within the agricultural area. In some cases, calculating the drainage flows might be based at least in part on the identified one or more elevation points, the slope, the depth to bedrock, and/or the saturated hydraulic conductivity, or the like, at each of the plurality of locations. Method 300 might further comprise, at optional block 340, determining a maximum drainage flow rate for the agricultural area. In some embodiments, determining a maximum drainage flow rate might be based at least in part on one or a combination of two or more of the maximum rainfall amount, the location of each main drainage area of the agricultural area, and/or one or more of the identified one or more elevation points, the slope, the depth to bedrock, and the saturated hydraulic conductivity of the soil at each of the plurality of locations within the agricultural area, or the like.

Method 300 might further comprise designating one or more locations for installing one or more main drainage pipes (block 345), determining a cross-sectional size of the one or more main drainage pipes (block 350), and/or determining a depth of the one or more main drainage pipes (optional block 355). In some embodiments, one or more of the processes at blocks 345-355 might be based at least in part on an optimization of location, depth, and/or size that is based at least in part on one or a combination of one or more of the one or more elevation points, the location of the one or more outlet points, the location of each of at least one main drainage area, the slope at each of the plurality of locations, other information included in the 3-D topographical survey, the depth to bedrock at each of the plurality of locations, the saturated hydraulic conductivity at each of the plurality of locations, other information included in the 3-D soil profile, the drainage area (or location thereof) for each main drainage pipe, the maximum rainfall amount, the drainage flows for the plurality of locations, the maximum drainage flow rate, presence and/or location of any existing drainage structures located within the agricultural area, presence and/or location of any existing natural or man-made structures located within the agricultural area, 3-D models of drainage flows and/or the drainage system (that may be based at least in part on one or more of these characteristics), and/or the like.

Method 300 might comprise determining at least one of a location, a depth, and/or a cross-sectional size of one or more sub-main drainage pipes (optional block 360) and/or determining at least one of a location, a depth, and/or a cross-sectional size of one or more lateral drainage pipes (optional block 365). In some cases, each of these determinations might be based at least in part on the three-dimensional topographic survey, the three-dimensional soil profile, and/or three-dimensional models. According to some embodiments, each of these determinations, as with similar determinations of location, depth, and cross-sectional size of the main drainage pipes, might be based at least in part on one or a combination of one or more of the one or more elevation points, the location of the one or more outlet points, the location of each of at least one main drainage area, the slope at each of the plurality of locations, other information included in the 3-D topographical survey, the depth to bedrock at each of the plurality of locations, the saturated hydraulic conductivity at each of the plurality of locations, other information included in the 3-D soil profile, the drainage area (or location thereof) for each main drainage pipe, the maximum rainfall amount, the drainage flows for the plurality of locations, the maximum drainage flow rate, and/or the like.

At block 370, method 300 might comprise sending instructions to agricultural machinery or equipment (which might include, without limitation, one or more of earth-moving machines, tractors, plows, diggers, excavators, trucks, trailers, drainage pipe/tile laying machines, trenching machines, pipe installation machines, and/or other suitable machine or equipment that is configured to remove layer(s) of soil to particular depths, lay and connect drainage pipes, and cover the drainage pipes with appropriate layer(s) of soil set at desired grading and slope, and/or the like) to install the one or more main drainage pipes (as well as any sub-main and/or lateral drainage pipes). In some cases, sending the instructions to install the various drainage pipes might include, without limitation, creating a guidance swath (or autopilot path or manual mode-assistance path) for each of the agricultural machinery or equipment (in some cases, within an array of similar agricultural machinery or equipment) to move from one position to another within the agricultural area, along with volume, length, width, and/or depth information, or the like, of which layers of soil to remove at each identified location to create a trench, as well as the length, depth, and connections for each drainage pipe to be installed in the trench, and the volume and type (or layer) of soil to fill the trench (on top of the installed drainage pipe). In some instances, the guidance swath (or autopilot path or manual mode-assistance path) might include distance information and/or GPS or other location coordinates at one or more points along the path.

Figure 4A:
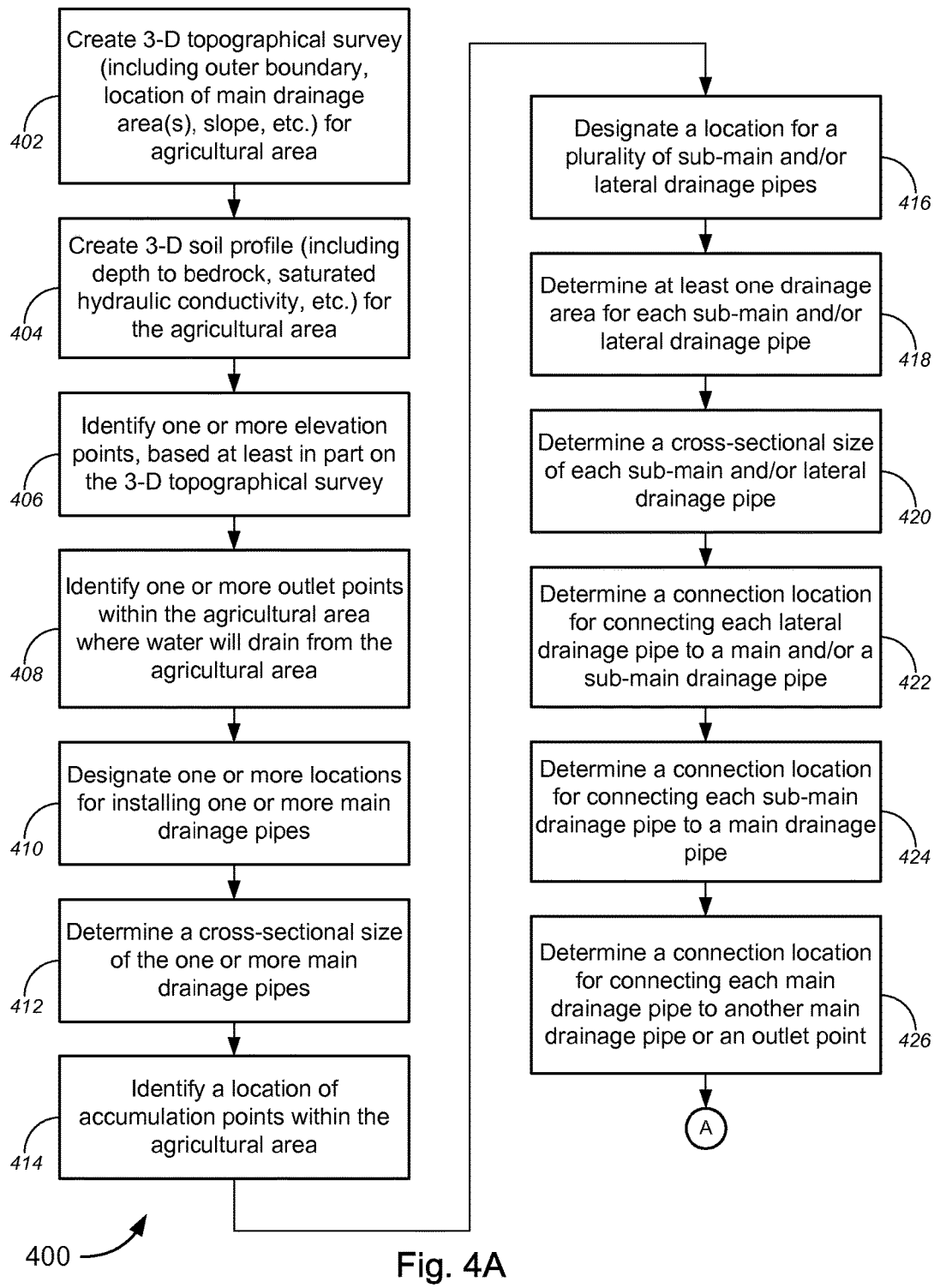
FIGS. 4A and 4B are flow diagrams illustrating another method for designing and/or implementing a drainage system for an agricultural area, based at least in part on three-dimensional soil modeling, in accordance with various embodiments.
Figure 4B:
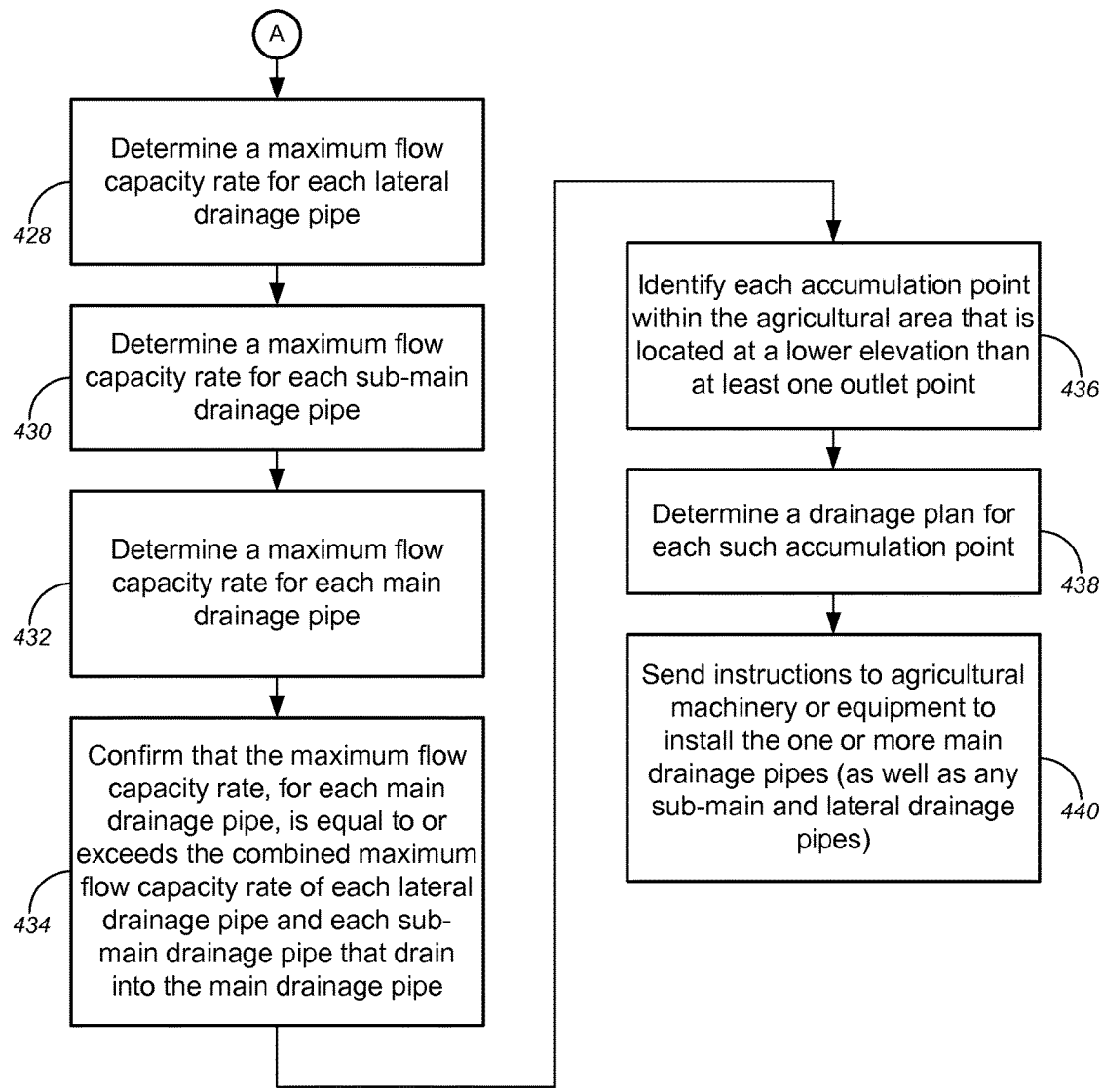

FIGS. 4A and 4B (collectively, "FIG. 4") are flow diagrams illustrating another method 400 for designing and/or implementing a drainage system for an agricultural area, based at least in part on three-dimensional soil modeling, in accordance with various embodiments. Method 400 of FIG. 4 is similar to method 300 of FIG. 3, except that method 400 also takes into consideration installation of sub-main and/or lateral drainage pipes and determination of connection points connecting the various types of pipes in the drainage network within the agricultural area all ultimately leading to one or more outlet points. With reference to FIG. 4, method 400 in FIG. 4A continues onto FIG. 4B, linked by circular marker denoted by "A."

While the techniques and procedures are depicted and/or described in a certain order for purposes of illustration, it should be appreciated that certain procedures may be reordered and/or omitted within the scope of various embodiments. Moreover, while the method illustrated by FIG. 4 can be implemented by or with (and, in some cases, are described below with respect to) the systems 100 and 200 of FIGS. 1 and 2, respectively (or components thereof), such methods may also be implemented using any suitable hardware implementation. Similarly, while each of the system 100 (and/or components thereof) of FIG. 1 or the system 200 (and/or components thereof) of FIG. 2 can operate according to the method illustrated by FIG. 4 (e.g., by executing instructions embodied on a computer readable medium), the systems 100 and 200 can each also operate according to other modes of operation and/or perform other suitable procedures.

In method 400 of FIG. 4, the processes at blocks 402-412 are similar to, if not identical to, the processes at blocks 305-320, 345, and 350, respectively. Thus, descriptions of the processes at blocks 305-330 similarly apply to the processes at blocks 402-412, and are omitted here to avoid excessive duplication.

At block 414, method 400 might comprise identifying a location of each of a plurality of accumulation points within the agricultural area where water will accumulate. In some embodiments, identifying a location of each of the plurality of accumulation points might be based at least in part on the three-dimensional topographic survey and the three-dimensional soil profile. Method 400, at block 416, might comprise designating a location for each of at least one of a plurality of sub-main drainage pipes and/or a plurality of lateral drainage pipes. In some cases, designating a location for each of at least one of the plurality of sub-main drainage pipes and/or the plurality of lateral drainage pipes might be based at least in part on an optimization of location that is based at least in part on the location of the one or more main drainage pipes and the location of the plurality of accumulation points. Method 400 might further comprise, at block 418, determining at least one of a drainage area(s) (or a location thereof) for each sub-main drainage pipe and/or a drainage area(s) (or a location thereof) for each lateral drainage pipe. In some instances, determining the drainage area(s) or a location(s) of the drainage area(s) for each sub-main drainage pipe and/or for each lateral drainage pipe might be based at least in part on the three-dimensional topographic survey. At block 420, method 400 might comprise determining a cross-sectional size of each sub-main drainage pipe and/or each lateral drainage pipe. In some cases, the determining the cross-sectional size of each sub-main and/or lateral drainage pipe might be based at least in part on one or more of the three-dimensional soil profile, the three-dimensional topographic survey, and/or the determined (location of) the drainage area(s) for each sub-main and/or lateral drainage pipe, or the like.

Method 400 might further comprise determining a connection location for each lateral drainage pipe to connect to at least one of a main drainage pipe and/or a sub-main drainage pipe (block 422), determining a connection location for each sub-main drainage pipe to connect to a main drainage pipe (block 424), and determining a connection location for each main drainage pipe to connect to at least one of another main drainage pipe and/or an outlet point (block 426). The process subsequently continues to block 428 in FIG. 4B, linked by the circular marker denoted by "A."

Method 400 might further comprise determining a maximum flow capacity rate for each lateral drainage pipe (block 428), determining a maximum flow capacity rate for each sub-main drainage pipe (block 430), and determining a maximum flow capacity rate for each main drainage pipe (block 432). In some embodiments, determining the maximum flow capacity rate for each lateral drainage pipe, each sub-main drainage pipe, and/or each main drainage pipe might be based at least in part on the cross-sectional size and/or the material(s) of that drainage pipe. At block 434, method 400 might comprise confirming that the maximum flow capacity rate, for each main drainage pipe, is equal to or exceeds the combined maximum flow capacity rate of each lateral drainage pipe and each sub-main drainage pipe that drain into that main drainage pipe.

Method 400, at block 436, might comprise identifying each accumulation point within the agricultural area that is located at a lower elevation than at least one outlet point of the one or more outlet points, in some cases, based at least in part on the three-dimensional topographic survey. Method 400 might further comprise, at block 438, determining a drainage plan for each such accumulation point—which might, in some embodiments, be based at least in part on an optimization of costs of pumping water at each such accumulation point to an elevation higher than the elevation of the at least one outlet point.

At block 440, method 400 might comprise sending instructions to agricultural machinery or equipment (which might include, without limitation, one or more of earth-moving machines, tractors, plows, diggers, excavators, trucks, trailers, drainage pipe/tile laying machines, trenching machines, pipe installation machines, and/or other suitable machine or equipment that is configured to remove layer(s) of soil to particular depths, lay and connect drainage pipes, and cover the drainage pipes with appropriate layer(s) of soil set at desired grading and slope) to install the one or more main drainage pipes (as well as any sub-main and/or lateral drainage pipes). In some cases, sending the instructions to install the various drainage pipes might include, without limitation, creating a guidance swath (or autopilot path or manual mode-assistance path) for each of the agricultural machinery or equipment (in some cases, within an array of similar agricultural machinery or equipment) to move from one position to another within the agricultural area, along with volume, length, width, and/or depth information, or the like, of which layers of soil to remove at each identified location to create a trench, as well as the length, depth, and connections for each drainage pipe to be installed in the trench, and the volume and type (or layer) of soil to fill the trench (on top of the installed drainage pipe). In some instances, the guidance swath (or autopilot path or manual mode-assistance path) might include distance information and/or GPS or other location coordinates at one or more points along the path.

Figure 5:
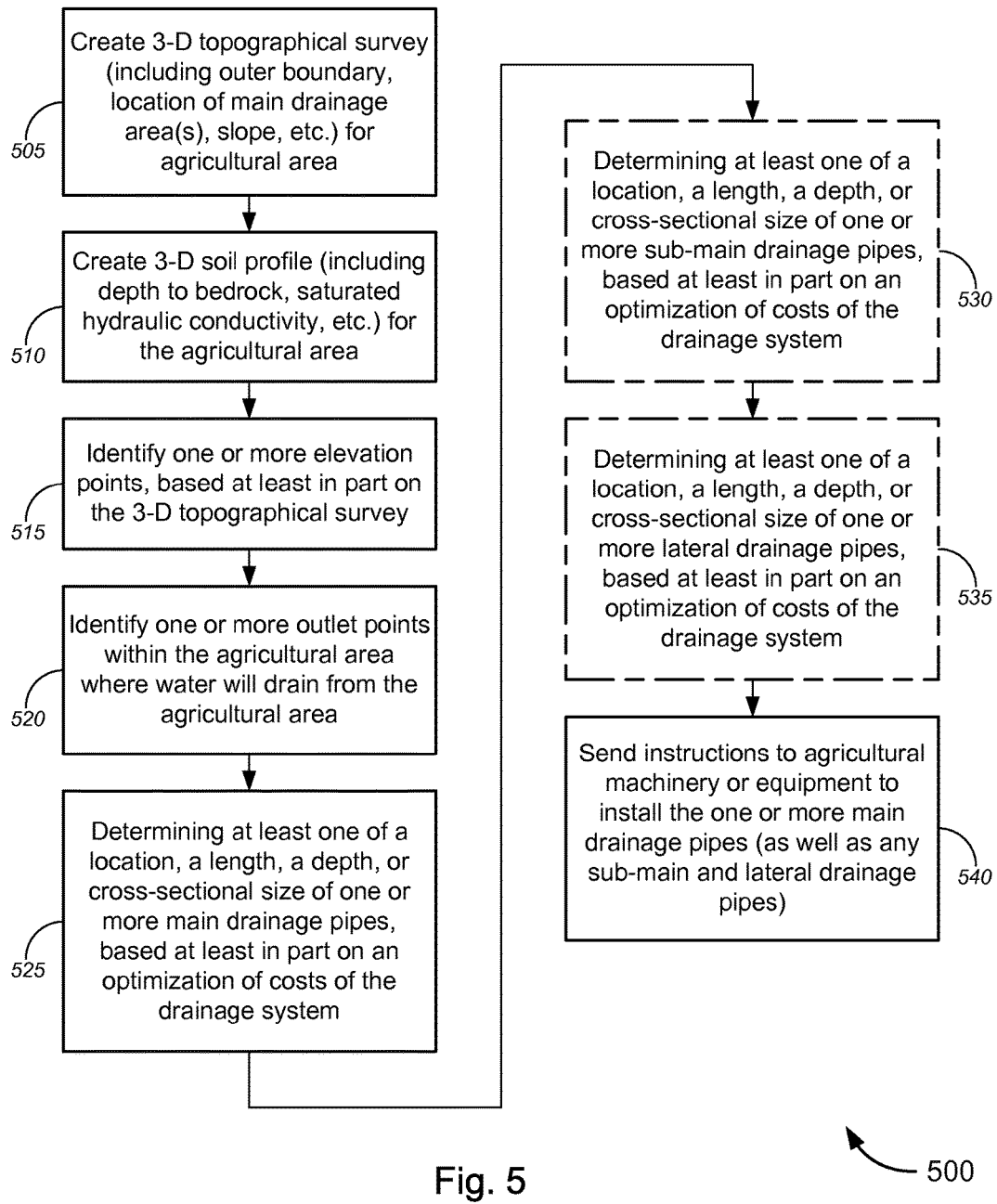
FIG. 5 is a flow diagram illustrating yet another method for designing and/or implementing a drainage system for an agricultural area, based at least in part on three-dimensional soil modeling, in accordance with various embodiments.

FIG. 5 is a flow diagram illustrating yet another 500 for designing and/or implementing a drainage system for an agricultural area, based at least in part on three-dimensional soil modeling, in accordance with various embodiments. Method 500 of FIG. 5 is similar to method 300 of FIG. 3 and method 400 of FIG. 4, except that method 500 takes into consideration optimization of costs of the drainage system when determining location, length, and cross-sectional size of the various drainage pipes.

While the techniques and procedures are depicted and/or described in a certain order for purposes of illustration, it should be appreciated that certain procedures may be reordered and/or omitted within the scope of various embodiments. Moreover, while the method illustrated by FIG. 5 can be implemented by or with (and, in some cases, are described below with respect to) the systems 100 and 200 of FIGS. 1 and 2, respectively (or components thereof), such methods may also be implemented using any suitable hardware implementation. Similarly, while each of the system 100 (and/or components thereof) of FIG. 1 or the system 200 (and/or components thereof) of FIG. 2 can operate according to the method illustrated by FIG. 5 (e.g., by executing instructions embodied on a computer readable medium), the systems 100 and 200 can each also operate according to other modes of operation and/or perform other suitable procedures.

In method 500 of FIG. 5, the processes at blocks 505-520 are similar to, if not identical to, the processes at blocks 305-320 of FIG. 3 or at blocks 402-408 of FIG. 4. Thus, descriptions of the processes at blocks 305-320 or at blocks 402-408 similarly apply to the processes at blocks 505-520, and are omitted here to avoid excessive duplication.

With reference to the embodiment of FIG. 5, method 500 might comprise, at block 525, determining at least one of a location, a length, a depth, and/or a cross-sectional size of one or more main drainage pipes, based at least in part on an optimization of costs for the drainage system. At optional block 530, method 500 might comprise determining at least one of a location, a length, a depth, and/or a cross-sectional size of one or more sub-main drainage pipes, based at least in part on the optimization of costs for the drainage system. Method 500, at optional block 535, might comprise determining at least one of a location, a length, a depth, and/or a cross-sectional size of one or more lateral drainage pipes, based at least in part on the optimization of costs for the drainage system. In some embodiments, optimization of costs of the drainage system might be based at least in part on minimizing the length of the one or more main drainage pipes, the one or more sub-main drainage pipes, and the one or more lateral drainage pipes. In some cases, optimization of costs of the drainage system might be based at least in part on determining natural water flow patterns within the agricultural area and modeling the flow patterns when particular locations, depths, and/or cross-sectional sizes of drainage pipes are used to modify or take advantage of the natural water flow patterns.

At block 540, method 500 might comprise sending instructions to agricultural machinery or equipment (which might include, without limitation, one or more of earth-moving machines, tractors, plows, diggers, excavators, trucks, trailers, drainage pipe/tile laying machines, trenching machines, pipe installation machines, and/or other suitable machine or equipment that is configured to remove layer(s) of soil to particular depths, lay and connect drainage pipes, and cover the drainage pipes with appropriate layer(s) of soil set at desired grading and slope) to install the one or more main drainage pipes (as well as any sub-main and/or lateral drainage pipes). In some cases, sending the instructions to install the various drainage pipes might include, without limitation, creating a guidance swath (or autopilot path or manual mode-assistance path) for each of the agricultural machinery or equipment (in some cases, within an array of similar agricultural machinery or equipment) to move from one position to another within the agricultural area, along with volume, length, width, and/or depth information, or the like, of which layers of soil to remove at each identified location to create a trench, as well as the length, depth, and connections for each drainage pipe to be installed in the trench, and the volume and type (or layer) of soil to fill the trench (on top of the installed drainage pipe). In some instances, the guidance swath (or autopilot path or manual mode-assistance path) might include distance information and/or GPS or other location coordinates at one or more points along the path.

With reference to methods 300-500 of FIGS. 3-5, after the topsoil and/or subsurface material have been removed to create the trenches, the one or more main/sub-main/lateral drainage pipes have been installed in the trenches, and the topsoil and/or subsurface material has been used to fill the trenches to maintain or create the desired depth and slope of soil (having desired soil characteristics and soil profile), final soil compositions may be obtained at each of these drainage pipe installation locations, and changes to the 3-D model for designing the drainage system may be made in order to further optimize the 3-D model for improved future designs of the drainage system.

Figure 6:
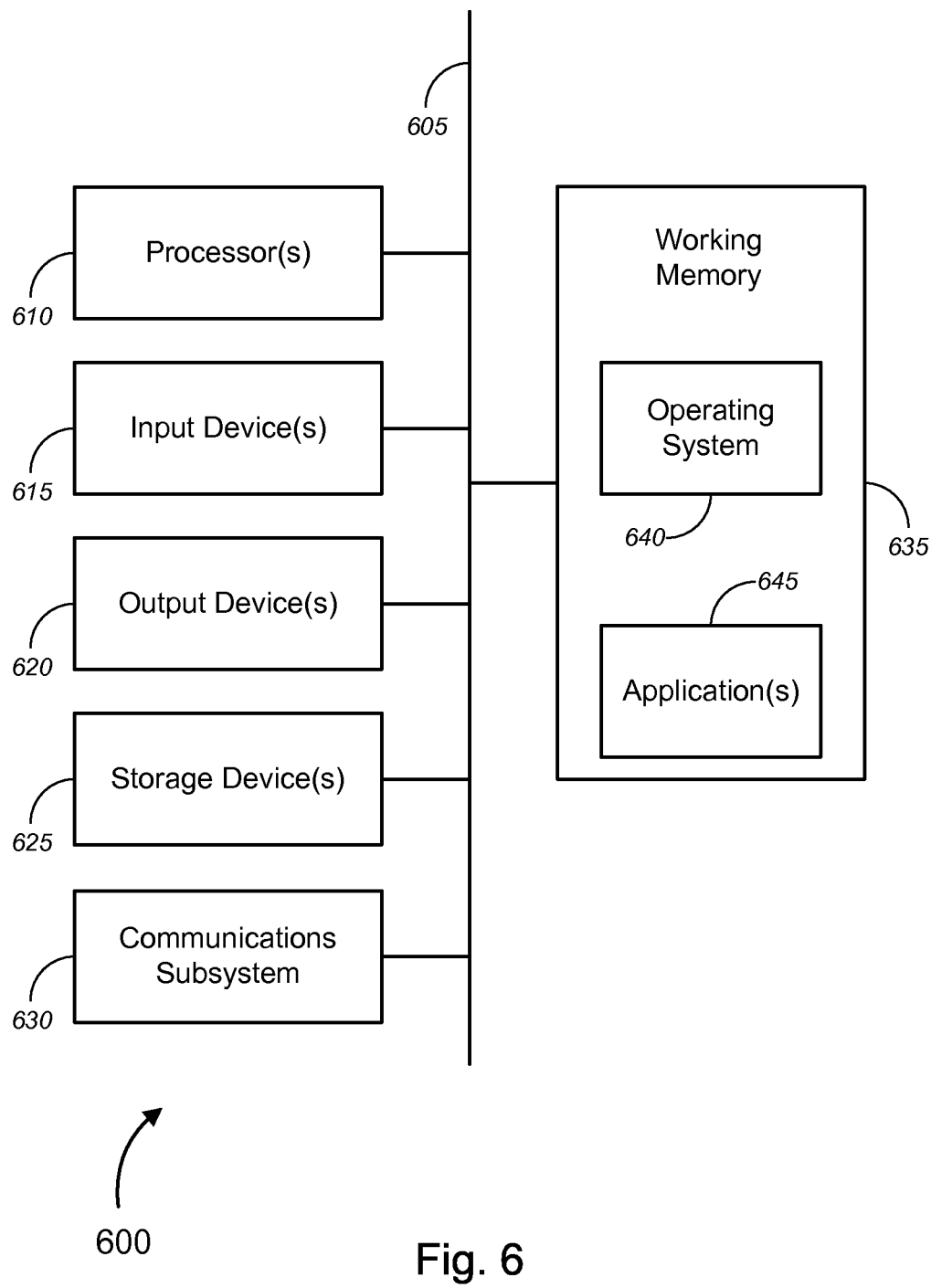
FIG. 6 is a block diagram illustrating an exemplary computer or system hardware architecture, in accordance with various embodiments.

FIG. 6 is a block diagram illustrating an exemplary computer or system hardware architecture, in accordance with various embodiments. FIG. 6 provides a schematic illustration of one embodiment of a computer system 600 of the system hardware that can perform the methods provided by various other embodiments, as described herein, and/or can perform the functions of computer or hardware system (i.e., host system) 115, 130, and/or 150, or of any other device (e.g., user device 105 or 110, survey equipment 135, and/or agricultural equipment or machinery 140 or 250, etc.), and/or the like, as described above. It should be noted that FIG. 6 is meant only to provide a generalized illustration of various components, of which one or more (or none) of each may be utilized as appropriate. FIG. 6, therefore, broadly illustrates how individual system elements may be implemented in a relatively separated or relatively more integrated manner.

The computer or hardware system 600—which might represent an embodiment of the computer or hardware system or host system 115, 130, and/or 150, or of any other device (e.g., user device 105 or 110, survey equipment 135, and/or agricultural equipment or machinery 140 or 250, etc.), described above with respect to FIGS. 1 and 2—is shown comprising hardware elements that can be electrically coupled via a bus 605 (or may otherwise be in communication, as appropriate). The hardware elements may include one or more processors 610, including, without limitation, one or more general-purpose processors and/or one or more special-purpose processors (such as digital signal processing chips, graphics acceleration processors, and/or the like); one or more input devices 615, which can include, without limitation, a mouse, a keyboard and/or the like; and one or more output devices 620, which can include, without limitation, a display device, a printer, and/or the like.

The computer or hardware system 600 may further include (and/or be in communication with) one or more storage devices 625, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including, without limitation, various file systems, database structures, and/or the like.

The computer or hardware system 600 might also include a communications subsystem 630, which can include, without limitation, a modem, a network card (wireless or wired), an infra-red communication device, a wireless communication device and/or chipset (such as a Bluetooth™ device, an 802.11 device, a WiFi device, a WiMax device, a WWAN device, cellular communication facilities, etc.), and/or the like. The communications subsystem 630 may permit data to be exchanged with a network (such as the network described below, to name one example), with other computer or hardware systems, and/or with any other devices described herein. In many embodiments, the computer or hardware system 600 will further comprise a working memory 635, which can include a RAM or ROM device, as described above.

The computer or hardware system 600 also may comprise software elements, shown as being currently located within the working memory 635, including an operating system 640, device drivers, executable libraries, and/or other code, such as one or more application programs 645, which may comprise computer programs provided by various embodiments (including, without limitation, hypervisors, VMs, and the like), and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be encoded and/or stored on a non-transitory computer readable storage medium, such as the storage device(s) 625 described above. In some cases, the storage medium might be incorporated within a computer system, such as the system 600. In other embodiments, the storage medium might be separate from a computer system (i.e., a removable medium, such as a compact disc, etc.), and/or provided in an installation package, such that the storage medium can be used to program, configure and/or adapt a general purpose computer with the instructions/code stored thereon. These instructions might take the form of executable code, which is executable by the computer or hardware system 600 and/or might take the form of source and/or installable code, which, upon compilation and/or installation on the computer or hardware system 600 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware (such as programmable logic controllers, field-programmable gate arrays, application-specific integrated circuits, and/or the like) might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer or hardware system (such as the computer or hardware system 600) to perform methods in accordance with various embodiments of the invention. According to a set of embodiments, some or all of the procedures of such methods are performed by the computer or hardware system 600 in response to processor 610 executing one or more sequences of one or more instructions (which might be incorporated into the operating system 640 and/or other code, such as an application program 645) contained in the working memory 635. Such instructions may be read into the working memory 635 from another computer readable medium, such as one or more of the storage device(s) 625. Merely by way of example, execution of the sequences of instructions contained in the working memory 635 might cause the processor(s) 610 to perform one or more procedures of the methods described herein.

The terms "machine readable medium" and "computer readable medium," as used herein, refer to any medium that participates in providing data that causes a machine to operate in a specific fashion. In an embodiment implemented using the computer or hardware system 600, various computer readable media might be involved in providing instructions/code to processor(s) 610 for execution and/or might be used to store and/or carry such instructions/code (e.g., as signals). In many implementations, a computer readable medium is a non-transitory, physical, and/or tangible storage medium. Such a medium may take many forms, including, but not limited to, non-volatile media, volatile media, and transmission media. Non-volatile media includes, for example, optical and/or magnetic disks, such as the storage device(s) 625. Volatile media includes, without limitation, dynamic memory, such as the working memory 635. Transmission media includes, without limitation, coaxial cables, copper wire and fiber optics, including the wires that comprise the bus 605, as well as the various components of the communication subsystem 630 (and/or the media by which the communications subsystem 630 provides communication with other devices). Hence, transmission media can also take the form of waves (including, without limitation, radio, acoustic and/or light waves, such as those generated during radio-wave and infra-red data communications).

Common forms of physical and/or tangible computer readable media include, for example, a floppy disk, a flexible disk, a hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read instructions and/or code.

Various forms of computer readable media may be involved in carrying one or more sequences of one or more instructions to the processor(s) 610 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer or hardware system 600. These signals, which might be in the form of electromagnetic signals, acoustic signals, optical signals, and/or the like, are all examples of carrier waves on which instructions can be encoded, in accordance with various embodiments of the invention.

The communications subsystem 630 (and/or components thereof) generally will receive the signals, and the bus 605 then might carry the signals (and/or the data, instructions, etc. carried by the signals) to the working memory 635, from which the processor(s) 605 retrieves and executes the instructions. The instructions received by the working memory 635 may optionally be stored on a storage device 625 either before or after execution by the processor(s) 610.

Figure 7:
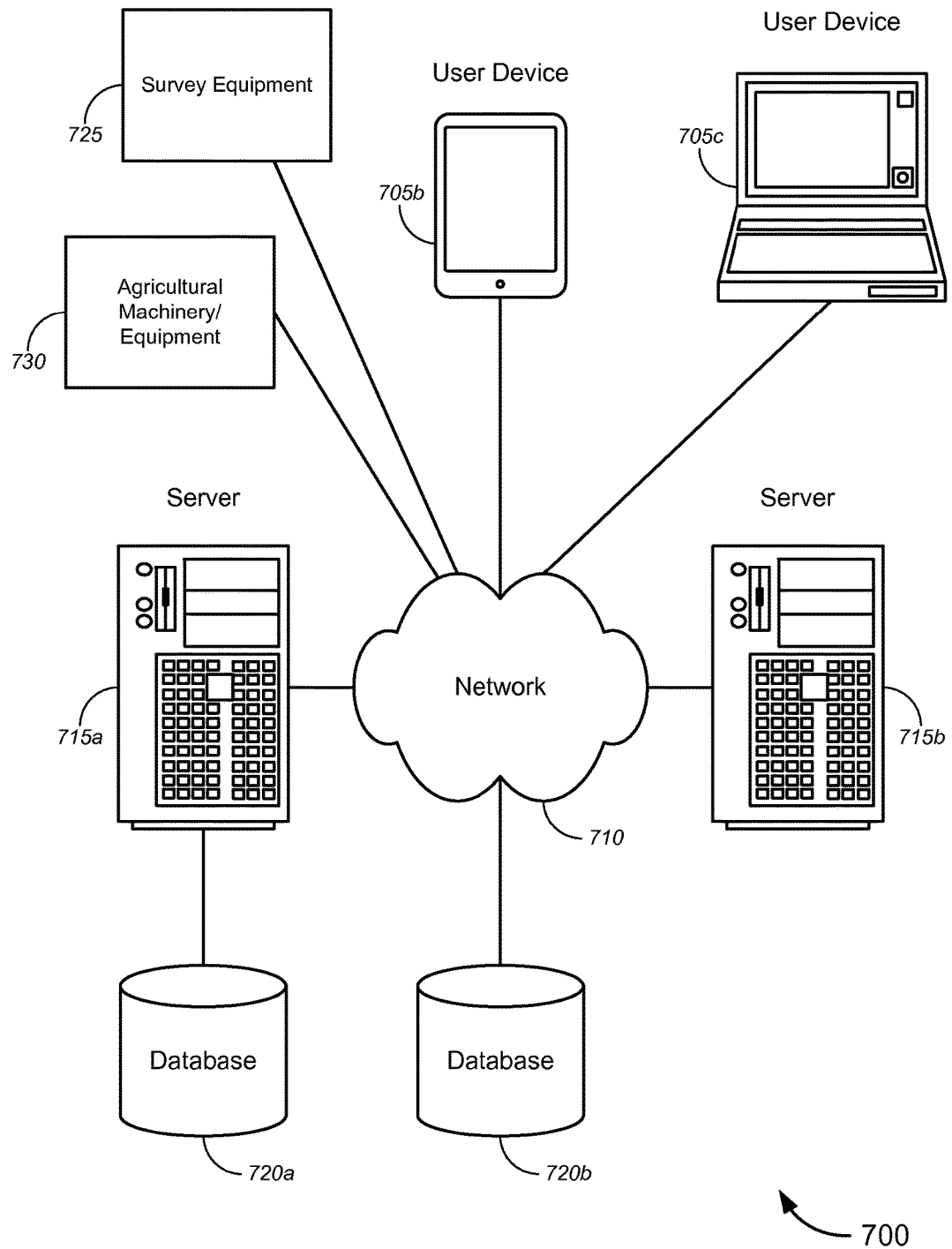
FIG. 7 is a block diagram illustrating a networked system of computers or computing systems, which can be used in accordance with various embodiments.

As noted above, a set of embodiments comprises methods and systems for designing and/or implementing a drainage system for an agricultural area, based at least in part on three-dimensional soil modeling. FIG. 7 illustrates a schematic diagram of a system 700 that can be used in accordance with one set of embodiments. The system 700 can include one or more user computers or user devices 705. A user computer or user device 705 can be a general purpose personal computer (including, merely by way of example, desktop computers, tablet computers, laptop computers, handheld computers, and the like, running any appropriate operating system, several of which are available from vendors such as Apple, Microsoft Corp., and the like), cloud computing devices, a server(s), and/or a workstation computer(s) running any of a variety of commercially-available UNIX™ or UNIX-like operating systems. A user computer or user device 705 can also have any of a variety of applications, including one or more applications configured to perform methods provided by various embodiments (as described above, for example), as well as one or more office applications, database client and/or server applications, and/or web browser applications. Alternatively, a user computer or user device 705 can be any other electronic device, such as a thin-client computer, Internet-enabled mobile telephone, and/or personal digital assistant, capable of communicating via a network (e.g., the network 710 described below) and/or of displaying and navigating web pages or other types of electronic documents. Although the exemplary system 700 is shown with three user computers or user devices 705, any number of user computers or user devices can be supported.

Certain embodiments operate in a networked environment, which can include a network 710. The network 710 can be any type of network familiar to those skilled in the art that can support data communications using any of a variety of commercially-available (and/or free or proprietary) protocols, including, without limitation, TCP/IP, SNA™, IPX™, AppleTalk™, and the like. Merely by way of example, the network 710 can include a local area network ("LAN"), including, without limitation, a fiber network, an Ethernet network, a Token-Ring™ network and/or the like; a wide-area network ("WAN"); a wireless wide area network ("WWAN"); a virtual network, such as a virtual private network ("VPN"); the Internet; an intranet; an extranet; a public switched telephone network ("PSTN"); an infra-red network; a wireless network, including, without limitation, a network operating under any of the IEEE 802.11 suite of protocols, the Bluetooth™ protocol known in the art, and/or any other wireless protocol; and/or any combination of these and/or other networks. In a particular embodiment, the network might include an access network of the service provider (e.g., an Internet service provider ("ISP")). In another embodiment, the network might include a core network of the service provider, and/or the Internet.

Embodiments can also include one or more server computers 715. Each of the server computers 715 may be configured with an operating system, including, without limitation, any of those discussed above, as well as any commercially (or freely) available server operating systems. Each of the servers 715 may also be running one or more applications, which can be configured to provide services to one or more clients 705 and/or other servers 715.

Merely by way of example, one of the servers 715 might be a data server, a web server, a cloud computing device(s), or the like, as described above. The data server might include (or be in communication with) a web server, which can be used, merely by way of example, to process requests for web pages or other electronic documents from user computers 705. The web server can also run a variety of server applications, including HTTP servers, FTP servers, CGI servers, database servers, Java servers, and the like. In some embodiments of the invention, the web server may be configured to serve web pages that can be operated within a web browser on one or more of the user computers 705 to perform methods of the invention.

The server computers 715, in some embodiments, might include one or more application servers, which can be configured with one or more applications accessible by a client running on one or more of the client computers 705 and/or other servers 715. Merely by way of example, the server(s) 715 can be one or more general purpose computers capable of executing programs or scripts in response to the user computers 705 and/or other servers 715, including, without limitation, web applications (which might, in some cases, be configured to perform methods provided by various embodiments). Merely by way of example, a web application can be implemented as one or more scripts or programs written in any suitable programming language, such as Java™, C, C#™ or C++, and/or any scripting language, such as Perl, Python, or TCL, as well as combinations of any programming and/or scripting languages. The application server(s) can also include database servers, including, without limitation, those commercially available from Oracle™, Microsoft™, Sybase™, IBM™, and the like, which can process requests from clients (including, depending on the configuration, dedicated database clients, API clients, web browsers, etc.) running on a user computer or user device 705 and/or another server 715. In some embodiments, an application server can perform one or more of the processes for designing and/or implementing a drainage system for an agricultural area, based at least in part on three-dimensional soil modeling, or the like, as described in detail above. Data provided by an application server may be formatted as one or more web pages (comprising HTML, JavaScript, etc., for example) and/or may be forwarded to a user computer 705 via a web server (as described above, for example). Similarly, a web server might receive web page requests and/or input data from a user computer 705 and/or forward the web page requests and/or input data to an application server. In some cases, a web server may be integrated with an application server.

In accordance with further embodiments, one or more servers 715 can function as a file server and/or can include one or more of the files (e.g., application code, data files, etc.) necessary to implement various disclosed methods, incorporated by an application running on a user computer 705 and/or another server 715. Alternatively, as those skilled in the art will appreciate, a file server can include all necessary files, allowing such an application to be invoked remotely by a user computer or user device 705 and/or server 715.

It should be noted that the functions described with respect to various servers herein (e.g., application server, database server, web server, file server, etc.) can be performed by a single server and/or a plurality of specialized servers, depending on implementation-specific needs and parameters.

In certain embodiments, the system can include one or more databases 720. The location of the database(s) 720 is discretionary: merely by way of example, a database 720a might reside on a storage medium local to (and/or resident in) a server 715a (and/or a user computer or user device 705). Alternatively, a database 720b can be remote from any or all of the computers 705, 715, so long as it can be in communication (e.g., via the network 710) with one or more of these. In a particular set of embodiments, a database 720 can reside in a storage-area network ("SAN") familiar to those skilled in the art. (Likewise, any necessary files for performing the functions attributed to the computers 705, 715 can be stored locally on the respective computer and/or remotely, as appropriate.) In one set of embodiments, the database 720 can be a relational database, such as an Oracle database, that is adapted to store, update, and retrieve data in response to SQL-formatted commands. The database might be controlled and/or maintained by a database server, as described above, for example.

In some embodiments, system 700 might further comprise survey equipment 725 (as described above with respect to FIGS. 1-5) that are in communication with server(s) 715 and/or user device(s) 705 over network 710. The survey equipment 725 might include, without limitation, at least one of air-based land survey equipment, land-based survey equipment, hand-held survey equipment, vehicle-based survey equipment, satellite-based land survey equipment, cameras, and/or the like. In some cases, system 700 might also comprise agricultural machinery and/or equipment 730, as described above with respect to FIGS. 1-5. The agricultural machinery and/or equipment 730 might include earth-moving machines, tractors, plows, diggers, excavators, trucks, trailers, drainage pipe/tile laying machines, trenching machines, pipe installation machines, and/or other suitable machine or equipment that is configured to remove layer(s) of soil to particular depths, lay and connect drainage pipes, and cover the drainage pipes with appropriate layer(s) of soil set at desired grading and slope.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. A method of designing and implementing a drainage system for an agricultural area, the method comprising:
creating, with a first computer, a three-dimensional topographic survey for the agricultural area, the three-dimensional topographic survey comprising an outer boundary, a location of each of at least one main drainage area of the agricultural area, and a slope at each of a plurality of locations throughout the agricultural area within the outer boundary;
creating, with the first computer, a three-dimensional soil profile for the agricultural area, the three-dimensional soil profile comprising information about a depth to bedrock and a saturated hydraulic conductivity of soil at each of the plurality of locations within the agricultural area;
identifying, with a second computer, one or more elevation points at each of the plurality of locations within the agricultural area, based at least in part on the three-dimensional topographic survey;
identifying a location of one or more outlet points within the agricultural area where water will drain from the agricultural area;
designating, with the second computer, one or more locations for installing one or more main drainage pipes, based at least in part on an optimization of location that is based at least in part on the three-dimensional soil profile, the one or more elevation points, and the location of the one or more outlet points, said optimization comprises applying a bulking factor of topsoil and subsurface materials, wherein designating the one or more locations comprising determining a maximum drainage flow rate for the agricultural area, based at least in part on the maximum rainfall amount, the location of each main drainage area of the agricultural area, and the identified one or more elevation points, the slope, the depth to bedrock, and the saturated hydraulic conductivity of the soil at each of the plurality of locations within the agricultural area;
determining, with the second computer, a cross-sectional size of the one or more main drainage pipes, based at least in part on the three-dimensional soil profile and the three-dimensional topographic survey; and installing the one or more drainage pipes at the designated one or more locations based on the determined cross-sectional size the determined maximum drainage flow rate and the optimization of the location, wherein the installing comprises sending instructions to at least one pipe installation machine to install the one or more drainage pipes.

2. The method of claim 1, further comprising:

calculating, with the second computer, drainage flows for the plurality of locations within the agricultural area, based at least in part on the identified one or more elevation points, the slope, the depth to bedrock, and the saturated hydraulic conductivity at each of the plurality of locations; and wherein designating the one or more locations for installing the one or more main drainage pipes is further based at least in part on an optimization of location that is based at least in part on the calculated drainage flows.

3. The method of claim 1, wherein identifying the location of the one or more outlet points within the agricultural area where water will drain from the agricultural area comprises:

providing, with the second computer, a user interface that allows a user to select outlet points within the agricultural area; and receiving, with the second computer, user input identifying a location of at least one outlet point within the agricultural area.

4. The method of claim 1, wherein identifying the location of the one or more outlet points within the agricultural area where water will drain from the agricultural area comprises identifying, with the second computer, a location of at least one outlet point within the agricultural area, based at least in part on the three-dimensional topographic survey and the three-dimensional topographic survey.

5. The method of claim 1, further comprises:

determining, with the second computer, a drainage area for each main drainage pipe, based at least in part on the three-dimensional topographic survey; and wherein determining the cross-sectional size of the one or more main drainage pipes comprises determining a cross-sectional size of each main drainage pipe, based at least in part on the three-dimensional soil profile and the three-dimensional topographic survey, and further based at least in part on the drainage area for each main drainage pipe.

6. The method of claim 1, further comprising:

determining, with the second computer, a maximum rainfall amount for the agricultural area; and wherein determining the cross-sectional size of the one or more main drainage pipes comprises determining a cross-sectional size of each main drainage pipe, based at least in part on the three-dimensional soil profile and the three-dimensional topographic survey, and further based at least in part on the maximum rainfall amount.

7. The method of claim 6, wherein determining the maximum rainfall amount for the agricultural area is based at least in part on the maximum historical rainfall amount for the agricultural area during a twenty-four hour period.

8. The method of claim 1, wherein determining the cross-sectional size of the one or more main drainage pipes is further based at least in part on the maximum drainage flow rate for the agricultural area.

9. The method of claim 1, further comprising:

identifying, with the second computer, a location of each of a plurality of accumulation points within the agricultural area where water will accumulate, based at least in part on the three-dimensional topographic survey and the three-dimensional soil profile;

designating, with the second computer, a location for each of at least one of a plurality of sub-main drainage pipes or a plurality of lateral drainage pipes, based at least in part on an optimization of location that is based at least in part on the location of the one or more main drainage pipes and the location of the plurality of accumulation points; and determining, with the second computer, a cross-sectional size of each sub-main drainage pipe or each lateral drainage pipe, based at least in part on the three-dimensional soil profile and the three-dimensional topographic survey.

10. The method of claim 9, further comprising:

determining, with the second computer, at least one of a drainage area for each sub-main drainage pipe or a drainage area for each lateral drainage pipe, based at least in part on the three-dimensional topographic survey; and wherein determining the cross-sectional size of each sub-main drainage pipe or each lateral drainage pipe is further based at least in part on the at least one of the drainage area for each sub-main drainage pipe or the drainage area for each lateral drainage pipe.

11. The method of claim 10, further comprising:

determining, with the second computer, a connection location for each lateral drainage pipe to connect to at least one of a main drainage pipe or a sub-main drainage pipe;

determining, with the second computer, a connection location for each sub-main drainage pipe to connect to a main drainage pipe; and determining, with the second computer, a connection location for each main drainage pipe to connect to at least one of another main drainage pipe or an outlet point.

12. The method of claim 10, further comprising:

determining, with the second computer, a maximum flow capacity rate for each lateral drainage pipe, based at least in part on the cross-sectional size of that lateral drainage pipe;

determining, with the second computer, a maximum flow capacity rate for each sub-main drainage pipe, based at least in part on the cross-sectional size of that sub-main drainage pipe;

determining, with the second computer, a maximum flow capacity rate for each main drainage pipe, based at least in part on the cross-sectional size of that main drainage pipe; and confirming, with the second computer, that the maximum flow capacity rate, for each main drainage pipe, is equal to or exceeds the combined maximum flow capacity rate of each lateral drainage pipe and each sub-main drainage pipe that drain into that main drainage pipe.

13. The method of claim 12, further comprising:

determining, with the second computer, a maximum flow capacity rate for each lateral drainage pipe, based at least in part on the material of that lateral pipe;

determining, with the second computer, a maximum flow capacity rate for each sub-main drainage pipe, based at least in part on the material of that sub-main drainage pipe; and determining, with the second computer, a maximum flow capacity rate for each main drainage pipe, based at least in part on the material of that main drainage pipe; and confirming, with the second computer, that the maximum flow capacity rate, for each main drainage pipe, is equal to or exceeds the combined maximum flow capacity rate of each lateral drainage pipe and each sub-main drainage pipe that drain into that main drainage pipe.

14. The method of claim 9, further comprising:
identifying, with the second computer, each accumulation point within the agricultural area that is located at a lower elevation than at least one outlet point of the one or more outlet points, based at least in part on the three-dimensional topographic survey; and
determining, with the second computer, a drainage plan for each such accumulation point, based at least in part on an optimization of costs of pumping water at each such accumulation point to an elevation higher than the elevation of the at least one outlet point.

15. The method of claim 1, further comprising:
determining, with the second computer, at least one of a location, a length, a depth, or a cross-sectional size of the one or more main drainage pipes, based at least in part on an optimization of costs for the drainage system.

16. The method of claim 15, further comprising:
determining, with the second computer, at least one of a location, a length, a depth, or a cross-sectional size of one or more sub-main drainage pipes, based at least in part on the optimization of costs for the drainage system; and
determining, with the second computer, at least one of a location, a length, a depth, or a cross-sectional size of one or more lateral drainage pipes, based at least in part on the optimization of costs for the drainage system.

17. The method of claim 16, wherein the optimization of costs of the drainage system is based at least in part on minimizing the length of at least one of the one or more main drainage pipes, the one or more sub-main drainage pipes, or the one or more lateral drainage pipes.

18. The method of claim 1, further comprising:
determining, with the second computer, a depth of the one or more main drainage pipes, based at least in part on the three-dimensional soil profile and the three-dimensional topographic survey;
determining, with the second computer, a location and a depth of one or more sub-main drainage pipes, based at least in part on the three-dimensional soil profile and the three-dimensional topographic survey; and
determining, with the second computer, a location and a depth of one or more lateral drainage pipes, based at least in part on the three-dimensional soil profile and the three-dimensional topographic survey.

19. The method of claim 1, wherein designating or determining the location of the one or more main drainage pipes and the cross-sectional size of the one or more main drainage pipes is further based at least in part on any existing drainage structures located within the agricultural area.

20. The method of claim 1, wherein the first computer and the second computer are the same computer.

21. A computer system, comprising:
one or more processors; and
a non-transitory computer readable medium in communication with the one or more processors, the non-transitory computer readable medium having encoded thereon a set of instructions executable by the one or more processors to cause the computer system to perform one or more operations, comprising:
creating a three-dimensional topographic survey for the agricultural area that comprises an outer boundary, a location of each of at least one main drainage area of the agricultural area, and a slope at each of a plurality of locations throughout the agricultural area within the outer boundary;
creating a three-dimensional soil profile for the agricultural area that comprises information about a depth to bedrock and a saturated hydraulic conductivity of soil at each of the plurality of locations within the agricultural area;
identifying one or more elevation points at each of the plurality of locations within the agricultural area, based at least in part on the three-dimensional topographic survey; instructions for identifying a location of one or more outlet points within the agricultural area where water will drain from the agricultural area;
designating one or more locations for installing one or more main drainage pipes, based at least in part on an optimization of location that is based at least in part on the three-dimensional soil profile, the one or more elevation points, and the location of the one or more outlet points, said optimization comprises applying a bulking factor of topsoil and subsurface materials, wherein designating the one or more locations comprising determining a maximum drainage flow rate for the agricultural area, based at least in part on the maximum rainfall amount, the location of each main drainage area of the agricultural area, and the identified one or more elevation points, the slope, the depth to bedrock, and the saturated hydraulic conductivity of the soil at each of the plurality of locations within the agricultural area;
determining a cross-sectional size of the one or more main drainage pipes, based at least in part on the three-dimensional soil profile and the three-dimensional topographic survey; and
causing at least one pipe installation machine to install the one or more drainage pipes at the designated one or more locations based on the determined cross-sectional size, the determined maximum drainage flow rate, and the optimization of the location.

* * * * *